(12) United States Patent
Fujiyoshi et al.

(10) Patent No.: US 11,188,166 B2
(45) Date of Patent: Nov. 30, 2021

(54) INPUT DEVICE

(71) Applicant: Alps Alpine Co., Ltd., Tokyo (JP)

(72) Inventors: Tatsumi Fujiyoshi, Miyagi-ken (JP); Hiroshi Shigetaka, Miyagi-ken (JP)

(73) Assignee: Alps Alpine Co., Ltd., Tokyo (JP)

( * ) Notice: Subject to any disclaimer, the term of this patent is extended or adjusted under 35 U.S.C. 154(b) by 52 days.

(21) Appl. No.: 16/836,380

(22) Filed: Mar. 31, 2020

(65) Prior Publication Data

US 2020/0225797 A1 Jul. 16, 2020

Related U.S. Application Data

(63) Continuation of application No. PCT/JP2018/034034, filed on Sep. 13, 2018.

(30) Foreign Application Priority Data

Oct. 2, 2017 (JP) .............................. JP2017-193129

(51) Int. Cl.
*G06F 3/041* (2006.01)
*H01L 41/04* (2006.01)
(Continued)

(52) U.S. Cl.
CPC .......... *G06F 3/0414* (2013.01); *H01L 41/042* (2013.01); *H01L 41/047* (2013.01); *H01L 41/1132* (2013.01); *G06F 2203/04101* (2013.01)

(58) Field of Classification Search
None
See application file for complete search history.

(56) References Cited

U.S. PATENT DOCUMENTS

| | | | |
|---|---|---|---|
| 2015/0070305 A1* | 3/2015 | Seo ........................ | G06F 3/0443 345/174 |
| 2016/0011722 A1* | 1/2016 | Lin ....................... | G06F 3/04164 345/174 |

(Continued)

FOREIGN PATENT DOCUMENTS

| | | |
|---|---|---|
| JP | 2014-202618 | 10/2014 |
| JP | 2014-235134 | 12/2014 |
| WO | 2015/053343 | 4/2015 |

OTHER PUBLICATIONS

International Search Report for International Application No. PCT/JP2018/034034 dated Dec. 11, 2018.

*Primary Examiner* — Brian M Butcher
(74) *Attorney, Agent, or Firm* — Beyer Law Group LLP

(57) ABSTRACT

An input device that inputs information corresponding to a change in pressure due to load includes: a first charge detection circuit that outputs a first detection signal corresponding to charges generated in a first piezoelectric sensor and a second piezoelectric sensor; and a switch circuit provided on a path through which the charges are transmitted from the first and second piezoelectric sensors to the first charge detection circuit. The first charge detection circuit alternately iterates a first period in which a first charge is input from a first positive electrode via the switch circuit and a second period in which a second charge is input from a second negative electrode via the switch circuit, reverses a sign of one of the first and second charges, combines a resulting charge with the other charge, and outputs the first detection signal corresponding to the amount of accumulation of the combined charge.

12 Claims, 12 Drawing Sheets

(51) Int. Cl.
*H01L 41/047* (2006.01)
*H01L 41/113* (2006.01)

(56) References Cited

U.S. PATENT DOCUMENTS

| | | | |
|---|---|---|---|
| 2016/0162079 A1* | 6/2016 | Jing | G06F 3/04144 345/174 |
| 2016/0195994 A1* | 7/2016 | Kitada | G06F 3/0446 345/174 |
| 2016/0202823 A1 | 7/2016 | Kodani et al. | |
| 2017/0068383 A1* | 3/2017 | Chern | G06F 3/04166 |
| 2017/0139518 A1* | 5/2017 | Oh | G06F 3/04144 |
| 2018/0088718 A1* | 3/2018 | Liu | G06F 3/04166 |
| 2018/0095582 A1* | 4/2018 | Hwang | H01L 27/323 |
| 2018/0166507 A1* | 6/2018 | Hwang | G06F 3/041 |
| 2019/0179472 A1* | 6/2019 | Keski-Jaskari | G06F 3/04166 |

* cited by examiner

INPUT DEVICE

CLAIM OF PRIORITY

This application is a Continuation of International Application No. PCT/JP2018/034034 filed on Sep. 13, 2018, which claims benefit of Japanese Patent Application No. 2017-193129 filed on Oct. 2, 2017. The entire contents of each application noted above are hereby incorporated by reference.

BACKGROUND OF THE INVENTION

1. Field of the Invention

The present disclosure relates to an input device that inputs information corresponding to a change in pressure due to load.

2. Description of the Related Art

Piezoelectric sensors have been widely used as one means for detecting pressures. FIGS. 3 and 4 in Japanese Unexamined Patent Application Publication No. 2014-202618 illustrate two methods for obtaining a detection result of a piezoelectric sensor. One method is transferring a change that is generated in a piezoelectric sensor in response to a change in pressure to a charge amplifier and detecting the charge (FIG. 3), and another method is detecting a voltage in a piezoelectric sensor while maintaining a charge (FIG. 4).

A piezoelectric sensor applies pressure to a highly insulating substance, such as ceramic, to cause dielectric polarization to thereby converting the pressure into an electrical signal. Thus, there are problems in that an impedance that serves as signal source increases, and a detection result becomes more susceptible to an influence of extraneous noise.

The present invention has been made in view of such a situation and provides an input device that can reduce an influence of extraneous noise when a piezoelectric sensor detects a change in pressure due to load.

SUMMARY OF THE INVENTION

There is provided an input device that inputs information corresponding to a change in pressure due to load. The input device includes: a first piezoelectric sensor and a second piezoelectric sensor that respectively generate charges corresponding to the change in the pressure due to the load; a first charge detection circuit that outputs a first detection signal corresponding to the charge generated in the first piezoelectric sensor and the charge generated in the second piezoelectric sensor; a switch circuit that is provided on a path through which the charges are transmitted from the first piezoelectric sensor and the second piezoelectric sensor to the first charge detection circuit; and a surface member that has a surface for receiving the load and that covers at least part of the first piezoelectric sensor and the second piezoelectric sensor. The first piezoelectric sensor includes: a first piezoelectric member, a first negative electrode that is provided at a portion where a negative charge is generated in the first piezoelectric member when the pressure changes in a predetermined direction, and a first positive electrode that is provided at a portion where a positive charge is generated in the first piezoelectric member when the pressure changes in the predetermined direction and that is located closer to the surface than the first negative electrode. The second piezoelectric sensor includes: a second piezoelectric member, a second positive electrode that is provided at a portion where a positive charge is generated in the second piezoelectric member when the pressure changes in the predetermined direction, and a second negative electrode that is provided at a position where a negative charge is generated in the second piezoelectric member when the pressure changes in the predetermined direction and that is located closer to the surface than the second positive electrode. The first charge detection circuit alternately iterates a first period in which the charge from the first piezoelectric sensor is input as a first charge and a second period in which the charge from the second piezoelectric sensor is input as a second charge, reverses a sign of one of the first charge and the second charge, combines a resulting charge with the other charge, and outputs the first detection signal corresponding to an amount of accumulation of the combined charge. The switch circuit forms a path through which a charge is transmitted from the first positive electrode to the first charge detection circuit in the first period and forms a path through which a charge is transmitted from the second negative electrode to the first charge detection circuit in the second period.

According to the present invention, it is possible to reduce an influence of extraneous noise when a piezoelectric sensor detects a change in pressure due to load.

DESCRIPTION OF THE PREFERRED EMBODIMENTS

First Embodiment

Figure 1:
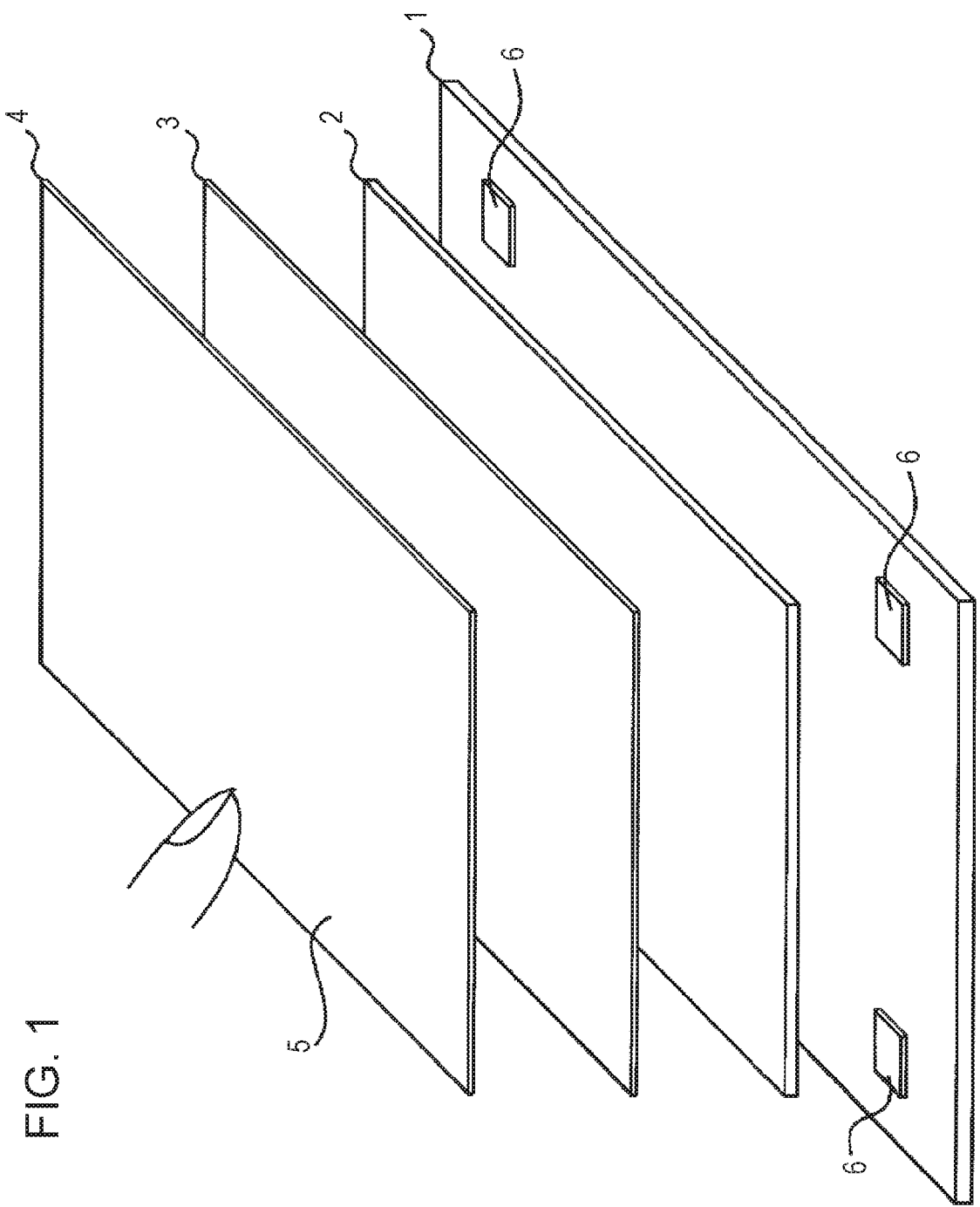
FIG. 1 is an exploded view illustrating one example of the structure of an input device according to a first embodiment.

An input device according to a first embodiment will be described below with reference to the accompanying drawings. FIG. 1 is an exploded view illustrating one example of the structure of an input device according to the first embodiment. The input device according to the present embodiment is a user interface device, such as a touchpad. For example, upon contact of a user's finger or the like, the input device detects its contact position and pressing force. In the example in FIG. 1, the input device has a base 1, such as a metal plate, a circuit board 2 fixed to the base 1 via elastic supporting members 6, a surface member 4 having a surface 5 for receiving load due to contact of an object, such as a finger, and a piezoelectric sensor sheet 3 provided between the circuit board 2 and the surface member 4.

Figure 2:
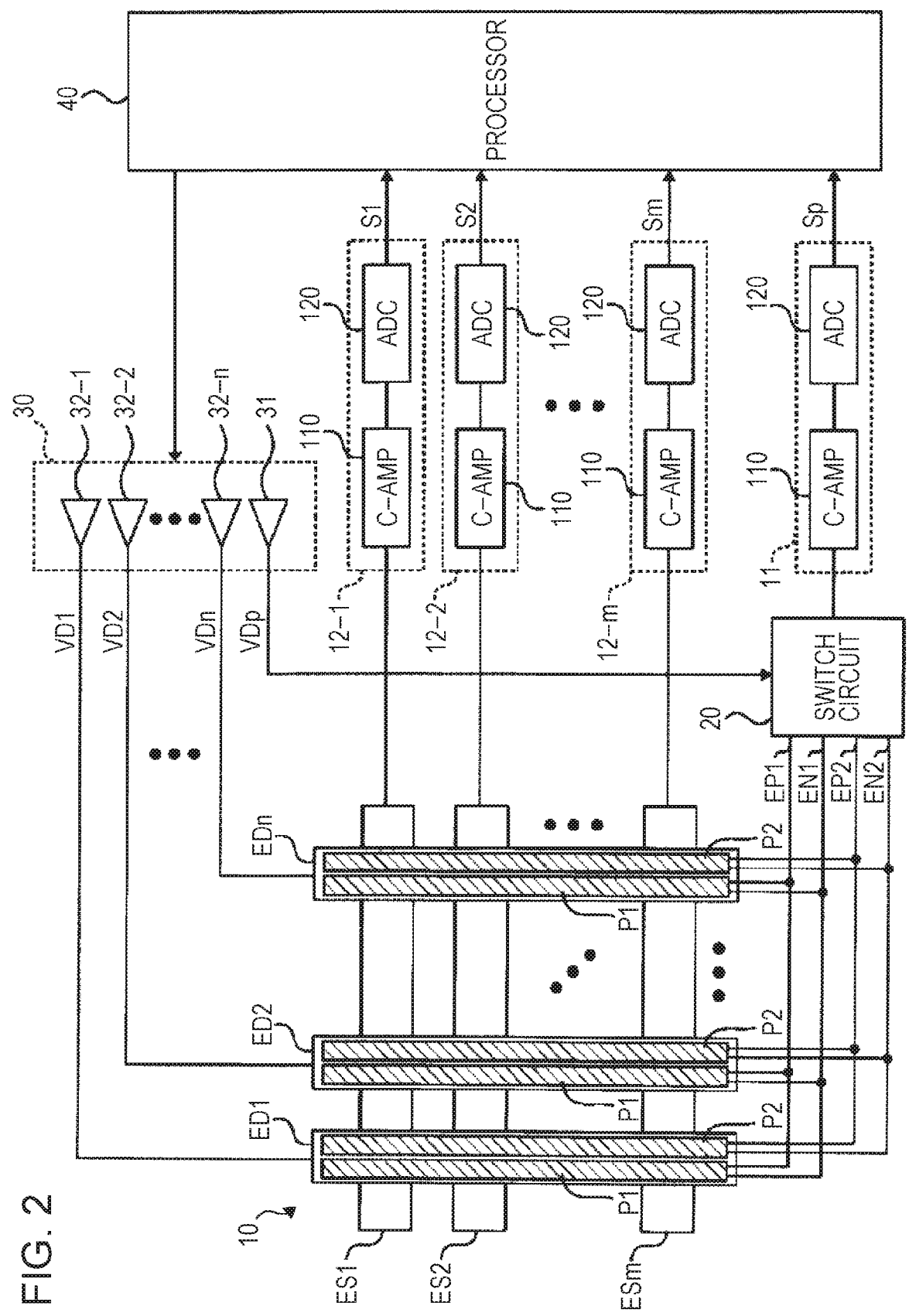
FIG. 2 is a diagram illustrating one example of the configuration of the input device according to the first embodiment.

FIG. 2 is a diagram illustrating one example of the configuration of the input device according to the first embodiment. In the example in FIG. 2, the input device has an electrostatic sensor portion 10, first piezoelectric sensors P1, second piezoelectric sensors P2, a first charge detection circuit 11, second charge detection circuits 12-1 to 12-$m$, a switch circuit 20, a driver 30, and a processor 40.

The electrostatic sensor portion 10 detects proximity of an object, such as a finger, at the surface 5 of the surface member 4, based on a change in electrostatic capacitance. The electrostatic sensor portion 10 illustrated in FIG. 2 includes m detection electrodes ES1 to ESm and n drive electrodes ED1 to EDn. The detection electrodes ES1 to ESm and the drive electrodes ED1 to EDn are formed individually as conductor patterns on the circuit board 2. The detection electrodes ES1 to ESm and the drive electrodes ED1 to EDn are formed to extend in directions that are orthogonal to each other and intersect each other in a lattice shape. Parasitic capacitors whose electrostatic capacitances change in response to proximity of an object, such as a finger, are formed at the respective intersection portions of the detection electrodes ES1 to ESm and the drive electrodes ED1 to EDn. In this case, when an arbitrary integer of 1 to m is represented by "j", and an arbitrary integer of 1 to n is represented by "i", one capacitor Cij is formed at the intersection portion of the detection electrode ESj and the drive electrode EDi, and m×n capacitors Cij are formed in the entire electrostatic sensor portion 10.

The first piezoelectric sensors P1 and the second piezoelectric sensors P2 respectively generate charges corresponding to a change in pressure due to load. Specifically, each first piezoelectric sensor P1 includes a first piezoelectric member PZ1, and each second piezoelectric sensor P2 includes a second piezoelectric member PZ2. The first piezoelectric member PZ1 and the second piezoelectric member PZ2 each cause dielectric polarization upon application of pressure due to load.

The first piezoelectric sensor P1 includes a first positive electrode EP1 and a first negative electrode EN1 that are provided at portions where charges having different signs are generated in the first piezoelectric member PZ1. The first positive electrode EP1 is provided at a portion where a positive charge is generated when pressure due to load on the surface member 4 changes in a predetermined direction (for example, when pressure that compresses the first piezoelectric member PZ1 and the second piezoelectric member PZ2 increases). The first negative electrode EN1 is provided at a portion where a negative charge is generated when the pressure changes in the predetermined direction. Accordingly, when pressure due to load changes in the predetermined direction, a positive charge is generated at the first positive electrode EP1 side of the first piezoelectric member PZ1, and a negative charge is generated at the first negative electrode EN1 side of the first piezoelectric member PZ1. Also, when the pressure due to load changes in the direction opposite to the predetermined direction, a negative charge is generated at the first positive electrode EP1 side of the first piezoelectric member PZ1, and a positive charge is generated at the first negative electrode EN1 side of the first piezoelectric member PZ1.

The second piezoelectric sensor P2 includes a second positive electrode EP2 and a second negative electrode EN2 that are provided at portions where charges having different signs are generated in the second piezoelectric member PZ2. The second positive electrode EP2 is provided at a portion where a positive charge is generated when pressure due to load on the surface member 4 changes in the aforementioned predetermined direction (for example, when pressure that compresses the first piezoelectric member PZ1 and the second piezoelectric member PZ2 increases). The second negative electrode EN2 is provided at a portion where a negative charge is generated when the pressure changes in the predetermined direction. Accordingly, when pressure due to load changes in the predetermined direction, a positive charge is generated at the second positive electrode EP2 side of the second piezoelectric member PZ2, and a negative charge is generated at the second negative electrode EN2 side of the second piezoelectric member PZ2. Also, when the pressure due to the load changes in the direction opposite to the predetermined direction, a negative charge is generated at the second positive electrode EP2 side of the second piezoelectric member PZ2, and a positive charge is generated at the second negative electrode EN2 side of the second piezoelectric member PZ2.

That is, when the pressure due to the load on the surface member 4 changes in the predetermined direction (for example, when the pressure that compresses the first piezoelectric member PZ1 and the second piezoelectric member PZ2 increases), positive charges are stored at the first positive electrode EP1 and the second positive electrode EP2, and negative charges are stored at the first negative electrode EN1 and the second negative electrode EN2. Also, when the pressure due to load on the surface member 4 changes in the direction opposite to the aforementioned predetermined direction, negative charges are stored at the first positive electrode EP1 and the second positive electrode EP2, and positive charges are stored at the first negative electrode EN1 and the second negative electrode EN2.

The first piezoelectric sensors P1 and the second piezoelectric sensors P2 are included in the piezoelectric sensor sheet 3 and are attached to both the circuit board 2 and the surface member 4 via adhesion layers.

Figure 3:
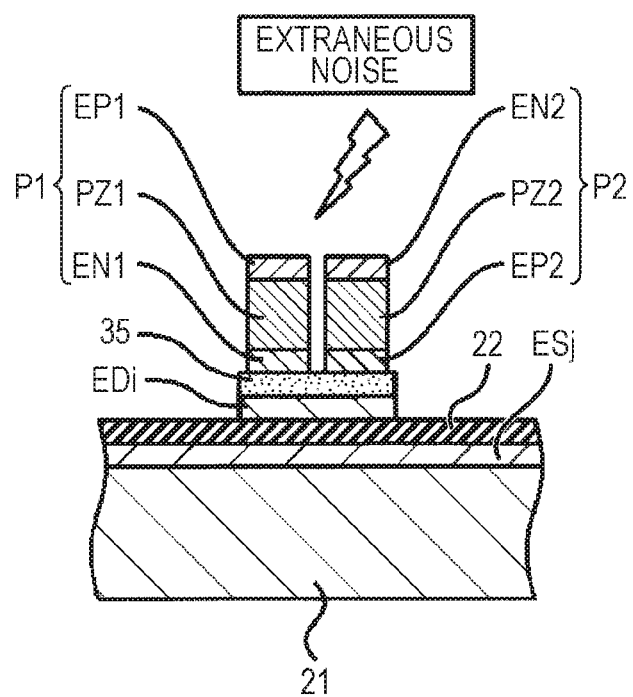
FIG. 3 is a sectional view illustrating one example of the structure of a portion where a detection electrode and a drive electrode intersect each other in the input device according to the first embodiment.

FIG. 3 is a sectional view illustrating one example of the structure of a portion where the detection electrode ESj and the drive electrode EDi intersect each other. In the example in FIG. 3, the detection electrode ESj is formed on a substrate 21 of the circuit board 2, and the drive electrode EDi is formed at an upper layer side (the surface 5 side) of the detection electrode ESj via an insulating layer 22. The first piezoelectric sensor P1 and the second piezoelectric sensor P2 are located more adjacent to the surface 5 than the drive electrode EDi and are attached to the circuit board 2 via an adhesion layer 35. That is, the drive electrode EDi is disposed closer to the surface 5 than the detection electrode ESj, and the first piezoelectric sensor P1 and the second piezoelectric sensor P2 are disposed closer to the surface 5 than the drive electrode EDi.

Also, with respect to closeness from the surface 5, the first piezoelectric sensor P1 and the second piezoelectric sensor P2 are opposite to each other in the positional relationship between the positive electrode (EN1, EN2) and the negative electrode (EP1, EP2). That is, in the first piezoelectric sensor P1, the first positive electrode EP1 is located closer to the surface 5 than the first negative electrode EN1, whereas in the second piezoelectric sensor P2, the second negative electrode EN2 is located closer to the surface 5 than the second positive electrode EP2. The first positive electrode EP1 of the first piezoelectric sensor P1 and the second negative electrode EN2 of the second piezoelectric sensor P2 are substantially equal in distance from the surface 5. Also, the first negative electrode EN1 of the first piezoelectric sensor P1 and the second positive electrode EP2 of the second piezoelectric sensor P2 are substantially equal in distance from the surface 5.

In addition, the first piezoelectric sensors P1 and the second piezoelectric sensors P2 illustrated in the example in FIG. 2 are disposed at places where at least part of the first piezoelectric sensors P1 and the second piezoelectric sensors P2 overlaps the drive electrodes EDi in a plan view viewed from a direction facing the surface 5. That is, the first piezoelectric sensors P1 and the second piezoelectric sensors P2 are attached to the surface 5 side of the drive electrodes ED1 to EDn and extend along the respective drive electrodes ED1 to EDn. At least part of the detection electrodes ES1 to ESm and the drive electrodes ED1 to EDn and at least part of the first piezoelectric sensors P1 and the second piezoelectric sensors P2 are covered by the surface member 4.

Figure 4:
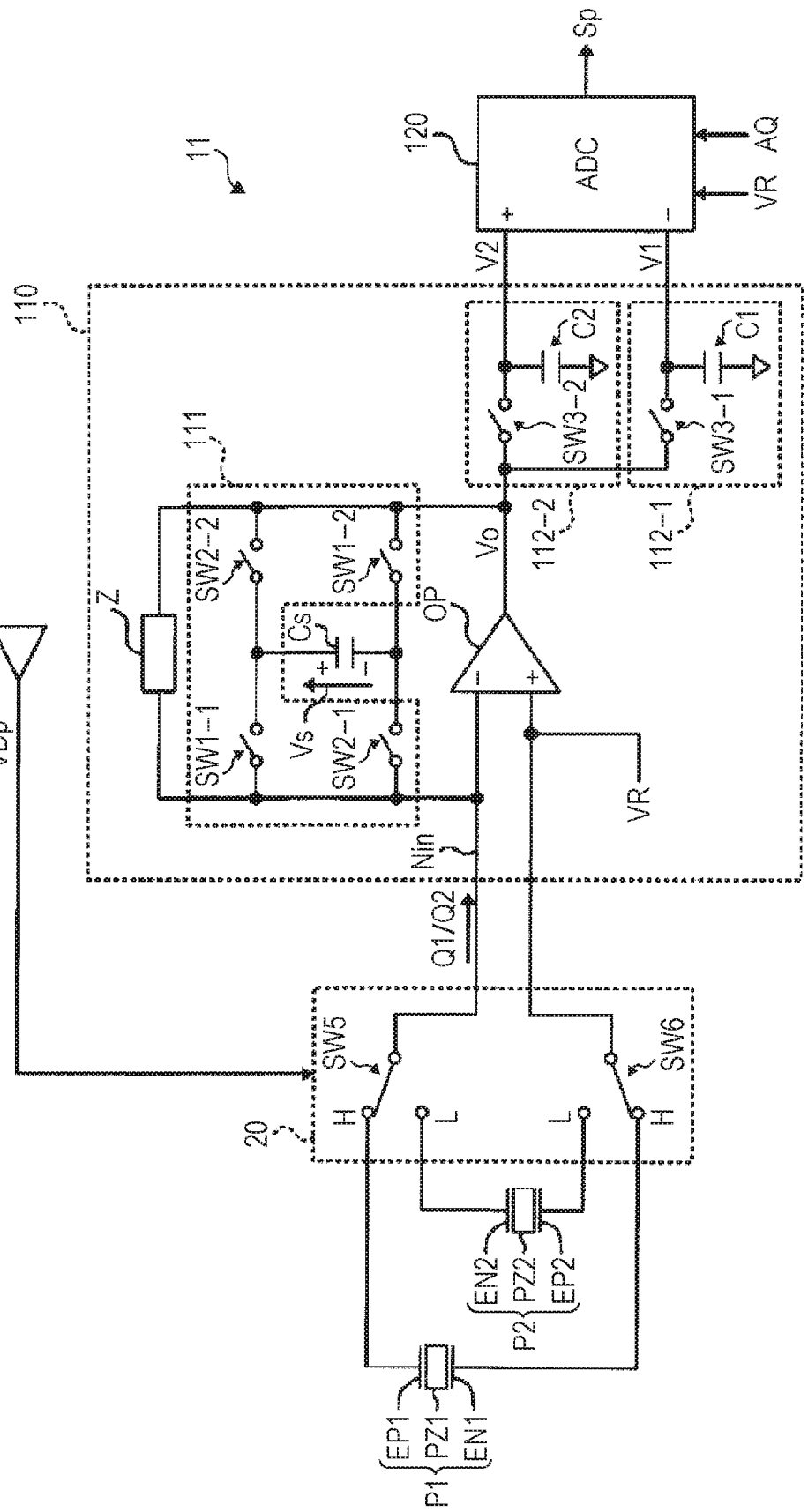
FIG. 4 is a diagram illustrating a configuration example of a first charge detection circuit and a switch circuit in the input device according to the first embodiment.

FIG. 4 is a diagram illustrating a configuration example of the first charge detection circuit 11 and the switch circuit 20.

The first charge detection circuit 11 outputs a first detection signal Sp corresponding to the charge generated in the first piezoelectric sensor P1 and the charge generated in the second piezoelectric sensor P2. That is, the first charge detection circuit 11 alternately iterates a first period T1 in which the charge from the first piezoelectric sensor P1 is input as a first charge Q1 and a second period T2 in which the charge from the second piezoelectric sensor P2 is input as a second charge Q2, reverses the sign of one of the first charge Q1 and the second charge Q2, combines the resulting charge with the other charge, and outputs a first detection signal Sp corresponding to the amount of accumulation of the combined charge.

For example, the first charge detection circuit 11 has an input node Nin connected to the first piezoelectric sensor P1 or the second piezoelectric sensor P2 via the switch circuit 20. The first charge detection circuit 11 inputs the charge (the first charge Q1 or the second charge Q2) from the input node Nin so that a voltage at the input node Nin approaches a reference voltage VR.

In the example in FIG. 4, the first charge detection circuit 11 includes a charge amplifier 110 and an analog-to-digital (AD) converter 120.

The charge amplifier 110 is a circuit that inputs the charge from the input node Nin so that the voltage at the input node Nin approaches the reference voltage VR. The charge amplifier 110 includes a capacitor for accumulating the charge. In the charge amplifier 110, the first charge Q1 is transmitted to one electrode of the capacitor in the first period T1, and the second charge Q2 is transmitted to another electrode of the capacitor in the second period T2. The charge amplifier 110 outputs voltages V1 and V2 corresponding to the amount of accumulation of the charge (the first charge Q1 and the second charge Q2) in the capacitor to the AD converter 120.

For example, the charge amplifier 110 includes an operational amplifier OP, a connection switching circuit 111, and a feedback capacitor Cs, as illustrated in FIG. 4. The operational amplifier OP outputs an output voltage Vo, which is a voltage obtained by amplifying the difference between the voltage at the input node Nin and the reference voltage VR. An inverting input terminal of the operational amplifier OP is connected to the input node Nin, and a non-inverting input terminal of the operational amplifier OP is connected to the reference voltage VR. One end of the feedback capacitor Cs is connected to the input node Nin via the connection switching circuit 111. Another end of the feedback capacitor Cs is connected to an output terminal of the output voltage Vo of the operational amplifier OP via the connection switching circuit 111. The connection switching circuit 111 switches between the direction of the connection of the feedback capacitor Cs between the output terminal of the output voltage Vo of the operational amplifier OP and the input node Nin in the first period T1 and the direction of the connection of the feedback capacitor Cs between the output terminal and the input node in the second period T2.

For example, the connection switching circuit 111 includes four switches SW1-1, SW1-2, SW2-1, and SW2-2, as illustrated in FIG. 4. The switch SW1-1 is connected between one terminal (hereinafter referred to as a "+ terminal") of the feedback capacitor Cs and the input node Nin. The switch SW1-2 is connected between another terminal (hereinafter referred to as a "− terminal") of the feedback capacitor Cs and an output terminal of the operational amplifier OP. The switch SW2-1 is connected between the − terminal of the feedback capacitor Cs and the input node Nin. The switch SW2-2 is connected between the + terminal of the feedback capacitor Cs and the output terminal of the operational amplifier OP. The switches SW1-1 and SW1-2 are turned on in the first period T1 and are turned off in the second period T2. The switches SW2-1 and SW2-2 are turned off in the first period T1 and are turned on in the second period T2.

Also, in the example in FIG. 4, the charge amplifier 110 includes a feedback impedance Z connected between the inverting input terminal and the output terminal of the operational amplifier OP. In a transition period between the first period T1 and the second period T2, the switches SW1-1, SW1-2, SW2-1, and SW2-2 in the connection switching circuit 111 are all turned off so that the charge in the feedback capacitor Cs is not discharged. In the transition period, the feedback impedance Z forms a negative feedback path from the output terminal of the operational amplifier OP to the inverting input terminal thereof to thereby suppress or reduce transient variations in the output voltage Vo. The feedback impedance Z includes, for example, a resistance element and has a resistance value set so that a time constant of the feedback capacitor Cs and the feedback impedance Z becomes sufficiently large compared with the cycle of the switching operation of the connection switching circuit 111.

In the example in FIG. 4, the charge amplifier 110 includes a signal holding circuit 112-1 that holds the output voltage Vo output by the operational amplifier OP in the first period T1 and a signal holding circuit 112-2 that holds the output voltage Vo output by the operational amplifier OP in the second period T2. The signal holding circuit 112-1 includes a switch SW3-1 and a capacitor C1, and the signal holding circuit 112-2 includes a switch SW3-2 and a capacitor C2. The capacitor C1 is connected between the output terminal of the operational amplifier OP and ground via the switch SW3-1. The capacitor C2 is connected between the output terminal of the operational amplifier OP and ground via the switch SW3-2. The charge amplifier 110 outputs each of the voltage V1 held in the signal holding circuit 112-1 and the voltage V2 held in the signal holding circuit 112-2 to the AD converter 120.

The AD converter 120 converts the difference between the voltages V1 and V2 output from the charge amplifier 110 into a digital first detection signal Sp and outputs the digital first detection signal Sp to the processor 40. In accordance with a control signal AQ output from the processor 40, the AD converter 120 converts the analog signals (the voltages V1 and V2) into the digital signal (the first detection signal Sp).

The switch circuit 20 is provided on a path through which the charge is transmitted from the first piezoelectric sensor P1 and the second piezoelectric sensor P2 to the first charge detection circuit 11. In the above-described first period T1, the switch circuit 20 forms a path through which the charge is transmitted from the first positive electrode EP1 of the first piezoelectric sensor P1 to the first charge detection circuit 11. Also, in the above-described second period T2, the switch circuit 20 forms a path through which the charge is transmitted from the second negative electrode EN2 of the second piezoelectric sensor P2 to the first charge detection circuit 11.

For example, in the first period T1, the switch circuit 20 connects the first positive electrode EP1 to the input node Nin and connects the first negative electrode EN1 to the reference voltage VR, and in the second period T2, the switch circuit 20 connects the second negative electrode EN2 to the input node Nin and connects the second positive electrode EP2 to the reference voltage VR.

In accordance with a drive voltage VDp output from a drive circuit 31 in the driver 30, the switch circuit 20 switches the path through which the charge from the first piezoelectric sensor P1 and the second piezoelectric sensor P2 is transmitted to the first charge detection circuit 11. For example, the switch circuit 20 includes switches SW5 and SW6, as illustrated in FIG. 4. The switch SW5 connects the first positive electrode EP1 to the input node Nin when the drive voltage VDp is at a high level and connects the second negative electrode EN2 to the input node Nin when the drive voltage VDp is at a low level. The switch SW6 connects the first negative electrode EN1 to the reference voltage VR when the drive voltage VDp is at the high level and connects the second positive electrode EP2 to the reference voltage VR when the drive voltage VDp is at the low level.

Reference is made back to FIG. 2. The driver 30 includes drive circuits 32-1 to 32-n that apply drive voltages VD1 to VDn to the drive electrodes ED1 to EDn and the drive circuit 31 that outputs the drive voltage VDp to the switch circuit 20. The drive circuits 32-1 to 32-n and the drive circuit 31 set the drive voltages VD1 to VDn and the drive voltage VDp to a high level or low level in accordance with a control signal output from the processor 40.

The drive circuits 32-1 to 32-n are sequentially selected one by one, for example, in accordance with a control signal from the processor 40. The selected drive circuit 32-1 applies, to the drive electrode EDi, a periodic drive voltage VDi whose level in the first period T1 and level in the second period T2 change in directions that differ from each other. For example, the drive circuit 32-1 outputs a drive voltage VDi that rises from the low level to the high level in the first period T1 and that falls from the high level to the low level in the second period T2.

The drive circuit 31 outputs, for example, a voltage corresponding to a logical OR of at least some of the drive voltages VD1 to VDn as the drive voltage VDp. When the drive voltage VDp is the same as any one of the drive voltages VD1 to VDn, the drive circuit 31 may be omitted, and an output of any one of the drive circuits 32-1 to 32-n may be used to control the switch circuit 20.

Each second charge detection circuit 12-j outputs a second detection signal Sj corresponding to the charge input from the capacitor Cij via the detection electrode ESj in response to a change in the drive voltage VDi. That is, the second charge detection circuit 12-j inputs the charge from the capacitor Cij as a third charge Q3 in the above-described first period T1 and inputs the charge from the capacitor Cij as a fourth charge Q4 in the above-described second period T2. The second charge detection circuit 12-j reverses the sign of one of the third charge Q3 and the fourth charge Q4, combines the resulting charge with the other charge, and outputs the second detection signal Sj corresponding to the amount of accumulation of the combined charge.

Figure 5:
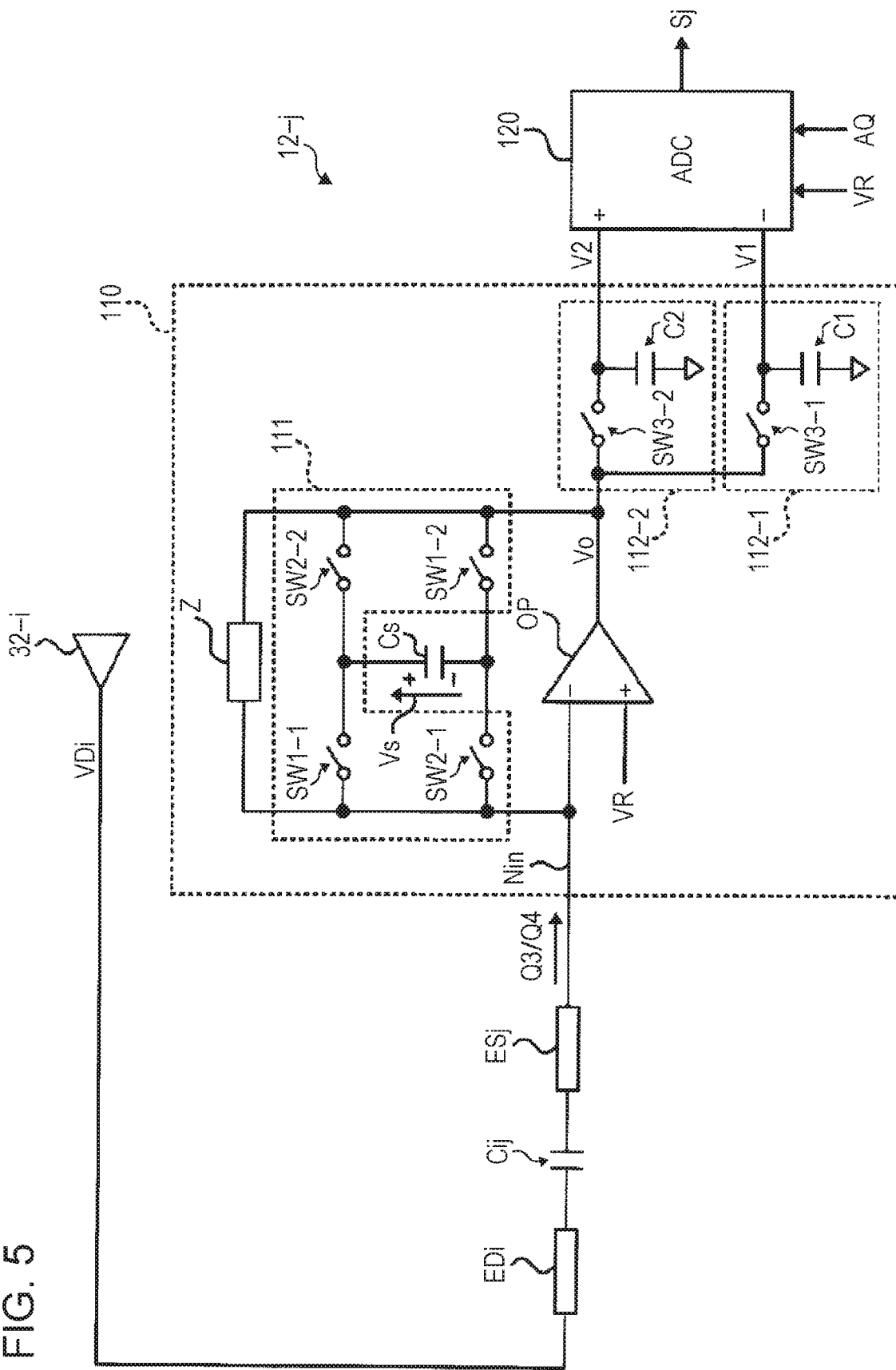
FIG. 5 is a diagram illustrating one example of the configuration of a second charge detection circuit.

FIG. 5 is a diagram illustrating one example of the configuration of the second charge detection circuit 12-j. In the example in FIG. 5, the second charge detection circuit 12-j includes a charge amplifier 110 and an AD converter 120, which are similar to those in the above-described first charge detection circuit 11 (FIG. 4). The input node Nin is connected to the detection electrode ESj, and the third charge Q3 and the fourth charge Q4 are accumulated in the feedback capacitor Cs. The charge amplifier 110 outputs, to the AD converter 120, the voltages V1 and V2 corresponding to the third charge Q3 and the fourth charge Q4 accumulated in the feedback capacitor Cs. The AD converter 120 converts the difference between the voltages V1 and V2 output from the charge amplifier 110 into a digital second detection signal Sj and outputs the digital second detection signal Sj to the processor 40.

The processor 40 is a device that performs control on an overall operation of the input device and includes, for example, a computer and dedicated hardware (such as a logic circuit). The computer executes an instruction in accordance with a program, and the dedicated hardware is configured so as to execute specific processing. The processor 40 may execute all processing by using the computer or may execute at least part of the processing by using the dedicated hardware. In order that outputting of drive voltages which is performed by the drive circuits 32-1 to 32-n and 31 in the driver 30, switching of a charge transmission path which is performed by the switch circuit 20, connection switching of the feedback capacitor Cs which is performed by the connection switching circuit 111, holding of the output voltage Vo which is performed by the signal holding circuits 112-1 and 112-2, AD conversion operation performed by the AD converter 120, and so on are performed at respective appropriate timings, the processor 40 controls operations of these circuits and converter. Also, the processor 40 performs obtaining a pressure detection result based on the first detection signal Sp, calculating an object contact position based on the second detection signals S1 to Sm, and so on.

Now, a description will be given of an operation of the input device according to the present embodiment having the above-described configuration.

<Pressure Detection by Piezoelectric Sensors P1 and P2>

Figure 6:
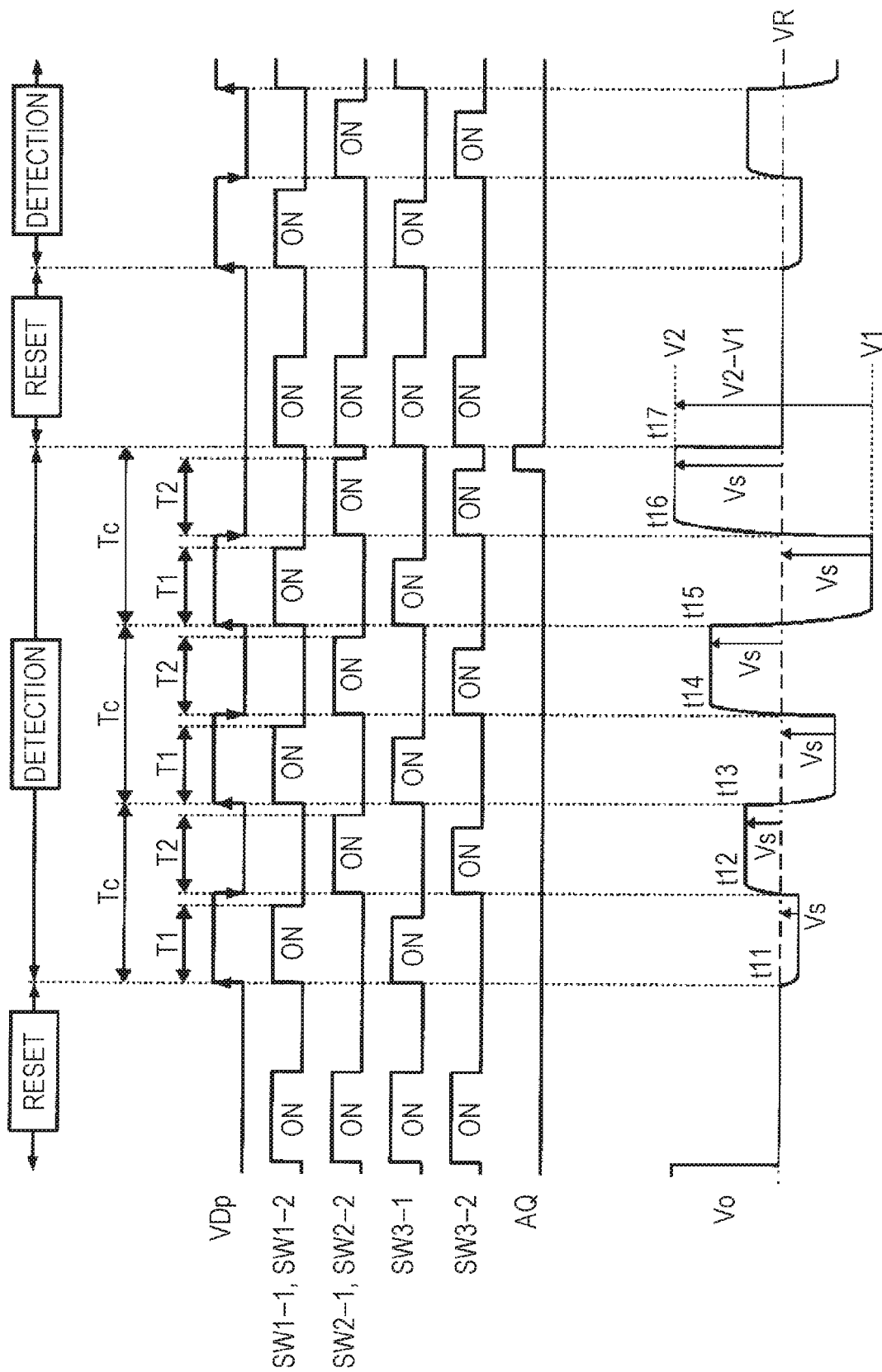
FIG. 6 is a timing diagram illustrating an example of signals in individual portions in the first charge detection circuit.

First, a description will be given of an operation for detecting pressure by using the first piezoelectric sensors P1 and the second piezoelectric sensors P2. FIG. 6 is a timing diagram illustrating an example of signals in the individual portions in the first charge detection circuit 11. In the example in FIG. 6, the input device alternately repeats an operation mode in which the charge in the feedback capacitor Cs is reset (this operation mode is hereinafter referred to as a "reset mode") and an operation mode in which the charge generated in the first piezoelectric sensor P1 and the second piezoelectric sensor P2 is detected (this operation mode is hereinafter referred to as a "detection mode").

In the reset mode, the input device turns on each of the switches SW1-1, SW1-2, SW2-1, and SW2-2 in the connection switching circuit 111 and also turns on each of the switch SW3-1 in the signal holding circuit 112-1 and the switch SW3-2 in the signal holding circuit 112-2. Hence, both ends of the feedback capacitor Cs are short-circuited, so that the charge accumulated in the feedback capacitor Cs is discharged. Also, the output voltage Vo output from the operational amplifier OP becomes equal to the reference voltage VR, so that the voltages V1 and V2 held in the signal holding circuits 112-1 and 112-2 become equal to the reference voltage VR.

In the detection mode, the input device alternately repeats the first period T1 in which the switches SW1-1 and SW1-2 are turned on and the switches SW2-1 and SW2-2 are turned off and the second period T2 in which the switches SW1-1 and SW1-2 are turned off and the switches SW2-1 and SW2-2 are turned on. Also, in the first period T1, the input device connects the first positive electrode EP1 of the first piezoelectric sensor P1 to the input node Nin and also connects the first negative electrode EN1 to the reference voltage VR, and in the second period T2, the input device connects the second negative electrode EN2 of the second piezoelectric sensor P2 to the input node Nin and also connects the second positive electrode EP2 to the reference voltage VR. Hence, in the first period T1, a path is formed through which the charge (the first charge Q1) is transmitted from the first positive electrode EP1 side of the first piezoelectric sensor P1 to the + terminal side of the feedback capacitor Cs. Also, in the second period T2, a path is formed through which the charge (the second charge Q2) is transmitted from the second negative electrode EN2 side of the second piezoelectric sensor P2 to the − terminal side of the feedback capacitor Cs.

In this case, the pressure due to load on the surface member 4 is assumed to change in a predetermined direction (for example, a direction in which the pressure that compresses the first piezoelectric member PZ1 and the second piezoelectric member PZ2 increases). In this case, owing to the piezoelectric effect of the first piezoelectric member PZ1 and the second piezoelectric member PZ2, positive charges are stored at the first positive electrode EP1 and the second positive electrode EP2, and negative charges are stored at the first negative electrode EN1 and the second negative electrode EN2.

In the first period T1, when a positive charge is stored at the first positive electrode EP1, the voltage at the input node Nin changes in a direction in which it increases relative to the reference voltage VR, since the first negative electrode EN1 is connected to the reference voltage VR. When the voltage at the input node Nin becomes higher than the reference voltage VR, the output voltage Vo of the operational amplifier OP decreases, a voltage at the − terminal side of the feedback capacitor Cs decreases, and the positive charge stored at the first positive electrode EP1 moves to the + terminal side of the feedback capacitor Cs. Owing to a negative feedback operation of the operational amplifier OP, the voltage at the input node Nin is maintained generally at the reference voltage VR. As a result, almost all the positive charge stored at the first positive electrode EP1 in the first period T1 moves to the + terminal side of the feedback capacitor Cs, and the voltage difference between the first positive electrode EP1 and the first negative electrode EN1 becomes substantially zero. When a positive first charge Q1 moves to the + terminal side of the feedback capacitor Cs, a negative charge corresponding to a charge having the reversed sign of the sign of the first charge Q1 is supplied to the − terminal side of the feedback capacitor Cs.

When the positive first charge Q1 is accumulated at the + terminal side of the feedback capacitor Cs, and the negative charge corresponding to the charge having the reversed sign of the sign of the first charge Q1 is accumulated at the − terminal side of the feedback capacitor Cs, a voltage corresponding to the electrostatic capacitance (hereinafter referred to as "Cs") of the feedback capacitor Cs and the amount (hereinafter referred to as "Q1") of the first charge Q1 is generated in the feedback capacitor Cs. That is, a voltage Vs at the + terminal relative to the − terminal of the feedback capacitor Cs increases by "Q1/Cs". When the voltage Vs at the feedback capacitor Cs increases in the first period T1 by "Q1/Cs", the output voltage Vo decreases by "Q1/Cs".

As the pressure changes in the predetermined direction by a large amount, the positive charge stored at the first positive electrode EP1 increases. Thus, the amount of the first charge Q1 accumulated in the feedback capacitor Cs in the first period T1 indicates the magnitude of the change in the pressure. In other words, the increased amount of the voltage Vs at the feedback capacitor Cs (the decreased amount of the output voltage Vo) "Q1/Cs" in the first period T1 indicates the magnitude by which the pressure changes in the predetermined direction.

In the second period T2, which follows the first period T1, when a negative charge is stored at the second negative electrode EN2, the voltage at the input node Nin changes in a direction in which it decreases relative to the reference voltage VR, since the first positive electrode EP1 is connected to the reference voltage VR. When the voltage at the input node Nin becomes lower than the reference voltage VR, the output voltage Vo of the operational amplifier OP increases, the voltage at the + terminal side of the feedback capacitor Cs increases, and the negative charge stored at the second negative electrode EN2 moves to the − terminal side of the feedback capacitor Cs. Owing to the negative feedback operation of the operational amplifier OP, the voltage at the input node Nin is maintained generally at the reference voltage VR. As a result, in the second period T2, almost all the negative charge stored at the second negative electrode EN2 moves to the − terminal side of the feedback capacitor Cs, and the voltage difference between the second negative electrode EN2 and the second positive electrode EP2 becomes substantially zero. When a negative second charge Q2 moves to the − terminal side of the feedback capacitor Cs, a positive charge corresponding to a charge having the reversed sign of the sign of the second charge Q2 is supplied to the + terminal side of the feedback capacitor Cs.

When the negative second charge Q2 is accumulated at the − terminal side of the feedback capacitor Cs, and the positive charge corresponding to the charge having the reversed sign of the sign of the second charge Q2 is accumulated at the + terminal side of the feedback capacitor Cs, a voltage corresponding to the electrostatic capacitance of the feedback capacitor Cs and the amount (hereinafter referred to as "Q2") of the second charge Q2 is generated in the feedback capacitor Cs. That is, the voltage Vs at the feedback capacitor Cs increases by "Q2/Cs". When the voltage Vs at the feedback capacitor Cs increases by "Q2/Cs" in the second period T2, the output voltage Vo increases by "Q2/Cs".

As the pressure changes in the predetermined direction by a large amount, the negative charge stored at the second negative electrode EN2 increases. Thus, the amount of the second charge Q2 accumulated in the feedback capacitor Cs in the second period T2 indicates the magnitude of the change in the pressure. In other words, the increased amount of the voltage Vs at the feedback capacitor Cs (the increased amount of the output voltage Vo) "Q2/Cs" in the second period T2 indicates the magnitude by which the pressure changes in the predetermined direction.

Meanwhile, the negative charge corresponding to the charge having the reversed sign of the sign of the first charge Q1 is already accumulated at the − terminal side of the feedback capacitor Cs after the first period T1. In the second period T2, which follows the first period T1, this already accumulated negative charge and the negative second charge Q2 newly transmitted from the second negative electrode EN2 are combined with each other, and the resulting charge is accumulated at the − terminal side of the feedback capacitor Cs. That is, after the first period T1 and the second period T2, a charge obtained by reversing the sign of one of the first charge Q1 and the second charge Q2 and combining the resulting charge with the other charge is accumulated in the feedback capacitor Cs. When the first period T1 and the second period T2 are alternately repeated in a state in which the pressure changes in the predetermined direction, the amount of accumulation of the combined charge increases, and the voltage Vs at the feedback capacitor Cs increases. Since the increased amounts in the voltages Vs in the first period T1 and the second period T2 each indicate the magnitude of a pressure change in the predetermined direction, a total increased amount of the voltages Vs owing to the alternate repetition of the first period T1 and the second period T2 also indicates the magnitude of the pressure change in the predetermined direction.

The output voltage Vo output by the operational amplifier OP becomes a voltage corresponding to the voltage generated in the feedback capacitor Cs and the reference voltage VR. That is, the output voltage Vo becomes "Vo=VR−Vs" in the first period T1 and becomes "Vo=VR+Vs" in the second period T2. When the pressure changes in a predetermined direction (for example, a direction in which the compressing pressure increases), the first charge Q1 is transmitted to the + terminal side of the feedback capacitor Cs in the first period T1, and the negative second charge Q2 is transmitted to the − terminal side of the feedback capacitor Cs in the second period T2. In this case, as illustrated in FIG. 6, in the first period T1 (a1 to t12, t13 to t14, and t15 to t16), the output voltage Vo becomes lower than the reference voltage VR, and in the second period T2 (t12 to t13, t14 to t15, and t16 to t17), the output voltage Vo becomes higher than the reference voltage VR. The voltage Vs at the feedback capacitor Cs relative to the − terminal side increases each time the first period T1 and the second period T2 are alternately repeated.

After each of the first period T1 and the second period T2 is iterated a predetermined number of times, the control signal AQ becomes active at a timing at which the signal holding circuits 112-1 and 112-2 are put into a signal holding state (the state in which the switches SW3-1 and SW3-2 are turned off). When the control signal AQ becomes active, the AD converter 120 converts the difference between the voltage V1 and the voltage V2 into the digital first detection signal Sp. The voltage V1 is the output voltage Vo held in the first period T1, and the voltage V2 is the output voltage Vo held in the second period T2. As illustrated in FIG. 6, the difference between the voltage V1 and the voltage V2 becomes about twice the voltage Vs at the feedback capacitor Cs. Accordingly, a first detection signal Sp1 corresponding to the difference between the voltage V1 and the voltage V2 is a signal corresponding to the voltage Vs at the feedback capacitor Cs and indicates the magnitude of the change in the pressure.

Figure 7:
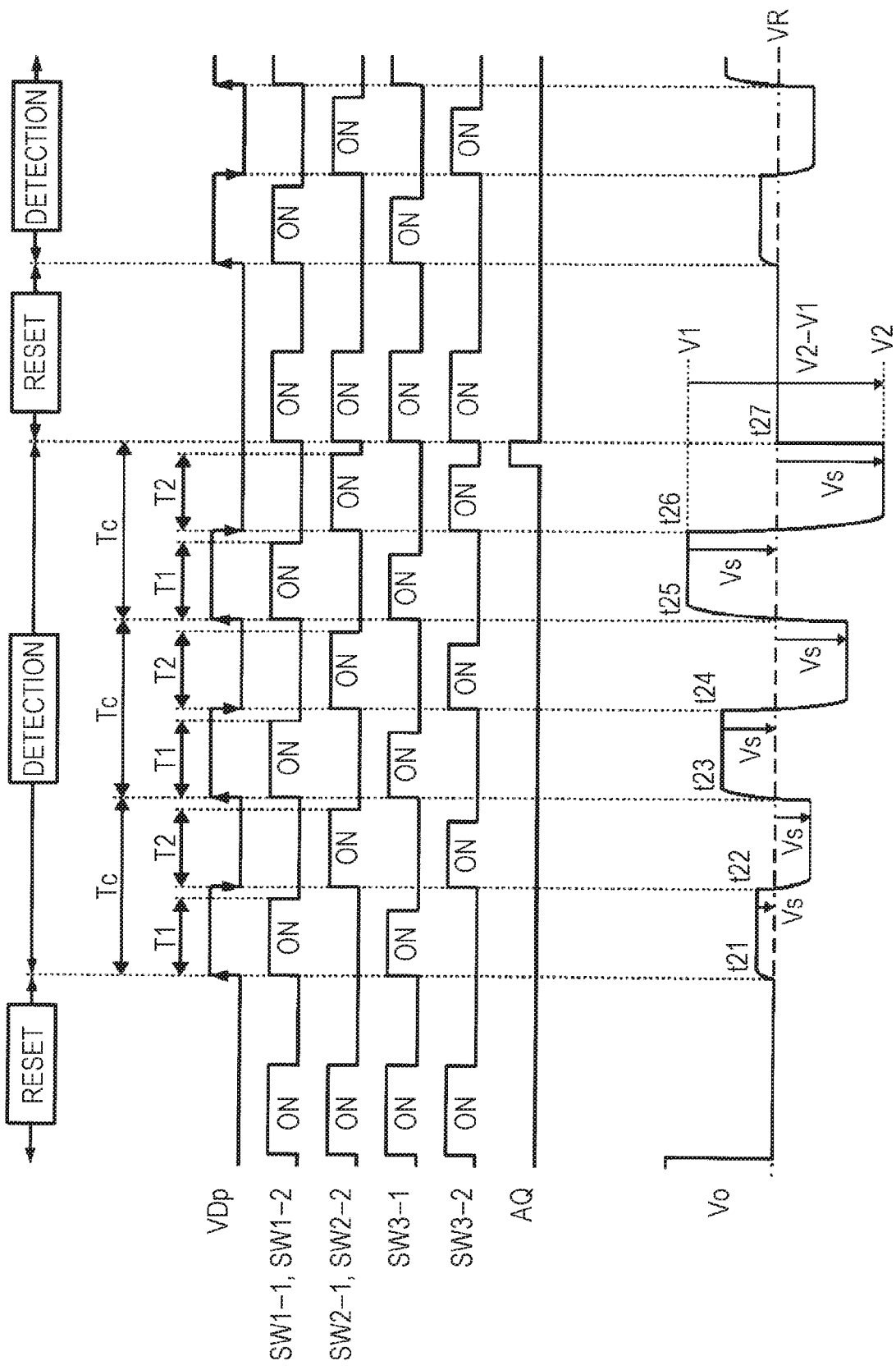
FIG. 7 is a timing diagram illustrating an example of signals in the individual portions in the first charge detection circuit and illustrating a case in which the direction of a change in pressure is opposite to the direction in the example in FIG. 6.

When the direction of a change of the pressure due to load on the surface member 4 is the direction opposite to the aforementioned predetermined direction (for example, when the direction in which the pressure that compresses the first piezoelectric member PZ1 and the second piezoelectric member PZ2 decreases), a negative first charge Q1 is transmitted to the feedback capacitor Cs in the first period T1, and a positive second charge Q2 is transmitted to the feedback capacitor Cs in the second period T2, in a manner opposite to that described above. In this case, as illustrated in FIG. 7, in the first period T1 (t21 to t22, t23 to t24, and t25 to t26), the output voltage Vo becomes higher than the reference voltage VR, and in the second period T2 (t22 to t23, t24 to t25, and t26 to t27), the output voltage Vo becomes lower than the reference voltage VR. The voltage Vs at the feedback capacitor Cs relative to the − terminal side decreases (the voltage Vs changes in the negative direction), each time the first period T1 and the second period T2 are alternately repeated. In this case, the amount of the charge accumulated in the feedback capacitor Cs owing to the repetition of the first period T1 and the second period T2 has a magnitude corresponding to the change in the pressure. Thus, the first detection signal Sp corresponding to the voltage Vs at the feedback capacitor Cs indicates the magnitude of a change in the pressure.

<Influence of Noise Superimposed on Outputs of Piezoelectric Sensors P1 and P2>

Next, a description will be given of an influence that extraneous noise superimposed on outputs of the first piezoelectric sensor P1 and the second piezoelectric sensor P2 has on a detection result of pressure.

When the change in the pressure is assumed to be sufficiently slow compared with a cycle Tc of iteration of the first period T1 and the second period T2, the direction of the change in the pressure in the first period T1 and the direction of the change in the pressure in the second period T2 are generally equal to each other. In this case, the first charge Q1 accumulated at the + terminal side of the feedback capacitor Cs in the first period T1 and the second charge Q2 accumulated at the − terminal side of the feedback capacitor Cs in the second period T2 have different signs. Accordingly, the amount of the charge accumulated in the feedback capacitor Cs after the first period T1 and the second period T2 becomes "Q1+Q2".

On the other hand, when the frequency of noise is assumed to be sufficiently long compared with the cycle Tc of iteration of the first period T1 and the second period T2 (the frequency of the noise is sufficiently low compared with "1/Tc"), a charge (which is hereinafter referred to as "noise charge Qn1", and "Qn1" also indicates the amount of charge) due to noise induced to the first positive electrode EP1 in the first period T1 and a charge (which is hereinafter referred to as "noise charge Qn2", and "Qn2" also indicates the amount of charge) due to noise induced to the second negative electrode EN2 in the second period T2 have generally the same sign. Then, when the first charge Q1 and the noise charge Qn1 have the same sign, the second charge Q2 and the noise charge Qn2 have different signs. Conversely, when the first charge Q1 and the noise charge Qn1 have different signs, the second charge Q2 and the noise charge Qn2 have the same sign.

When the first charge Q1 and the noise charge Qn1 have the same sign, the amount of the charge accumulated at the + terminal side of the feedback capacitor Cs in the first period T1 increases (Q1+Qn1) by an amount corresponding to the noise charge Qn1, compared with a case in which there is no noise. In this case, since the second charge Q2 and the noise charge Qn2 have different signs, the amount of the charge accumulated at the − terminal side of the feedback capacitor Cs in the second period T2 decreases (Q2−Qn2) by an amount corresponding to the noise charge Qn2, compared with a case in which there is no noise.

As a result, the amount of the charge accumulated in the feedback capacitor Cs after the first period T1 and the second period T2 becomes "Q1+Q2+(Qn1−Qn2)". That is, the noise charge Qn1 in the first period T1 and the noise charge Qn2 in the second period T2 cancel each other out, so that the amount of the charge due to the noise decreases as a whole.

On the other hand, when the first charge Q1 and the noise charge Qn1 have different signs, the amount of the charge accumulated at the + terminal side of the feedback capacitor Cs in the first period T1 decreases (Q1−Qn1) by an amount corresponding to the noise charge Qn1, compared with a case in which there is no noise. In this case, since the second charge Q2 and the noise charge Qn2 have the same sign, the amount of the charge accumulated at the − terminal side of the feedback capacitor Cs in the second period T2 increases (Q2+Qn2) by an amount corresponding to the noise charge Qn2, compared with a case in which there is no noise.

As a result, the amount of the charge accumulated in the feedback capacitor Cs after the first period T1 and the second period T2 becomes "Q1+Q2+(Qn2−Qn1)". That is, in this case, the noise charge Qn1 in the first period T1 and the noise charge Qn2 in the second period T2 also cancel each other out, so that the amount of the charge due to the noise decreases as a whole.

Also, in the input device according to the present embodiment, as illustrated in the example in FIG. 3, the first positive electrode EP1 is located closer to the surface 5 than the first negative electrode EN1, and the second negative electrode EN2 is located closer to the surface 5 than the second positive electrode EP2. An object, such as a finger, contacts the surface 5 of the surface member 4 to apply load thereto, and thus, the closer to the surface 5, the more susceptible to noise from the object that approaches the surface 5. That is, since the first positive electrode EP1 and the second positive electrode EP2 are located at positions that are susceptible to noise from an object that approaches the surface 5, noise that are akin to each other are likely to be induced. Thus, the noise charge Qn1 induced to the first positive electrode EP1 and the noise charge Qn2 induced to the second negative electrode EN2 are likely to have amounts that are approximately the same. Hence, the noise charge Qn1 and the noise charge Qn2 more effectively cancel each other out, so that the amount of noise charge accumulated in the feedback capacitor Cs after the first period T1 and the second period T2 decreases further.

Figure 8:
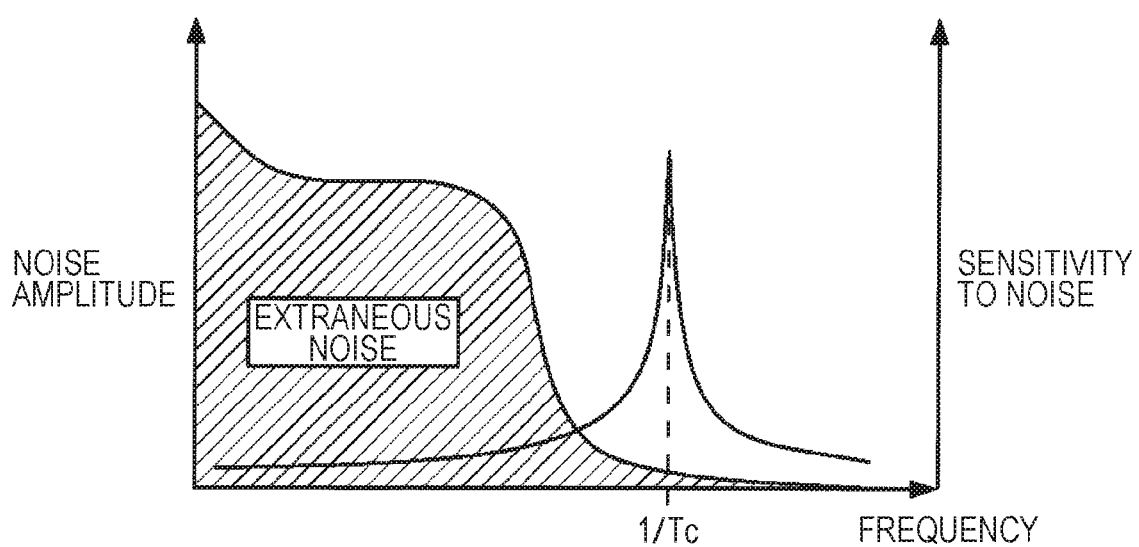
FIG. 8 is a graph illustrating an example of a frequency characteristic of sensitivity to noise.

FIG. 8 is a graph illustrating an example of a frequency characteristic of sensitivity to noise. Sensitivity to noise in the input device according to the present embodiment decreases, as the frequency gets away from the frequency (1/Tc) at which the first period T1 and the second period T2 are iterated, as illustrated in FIG. 8. Accordingly, when the frequency (1/Tc) is sufficiently increased compared with a frequency band of low frequencies at which extraneous noise is distributed, components of extraneous noise included in the first detection signal Sp are effectively reduced.

<Detection of Change in Electrostatic Capacitance in Electrostatic Sensor Portion 10>

Next, a description will be given of an operation for detecting an electrostatic capacitance of the capacitor Cij in the electrostatic sensor portion 10 which changes in response to proximity of an object.

An operation for generating the second detection signal Sj in the second charge detection circuit 12-j is generally the same as the above-described operation for generating the first detection signal Sp in the first charge detection circuit 11. For example, as in FIG. 6, the second charge detection circuit 12-j also has the reset mode and the detection mode. In the case of the reset mode, when the charge accumulated in the feedback capacitor Cs is discharged, the voltages V1 and V2 held in the signal holding circuits 112-1 and 112-2 become equal to the reference voltage VR. When the operation transitions to the detection mode, the charge (the third charge Q3) is transmitted from the detection electrode ESj side of the capacitor Cij to the + terminal side of the feedback capacitor Cs in the first period T1, and the charge (the fourth charge Q4) is transmitted from the detection electrode ESj side of the capacitor Cij to the − terminal side of the feedback capacitor Cs in the second period T2.

The drive circuits 32-1 to 32-n are sequentially selected one by one by the processor 40, and the selected drive circuit 32-1 outputs the drive voltage VDi. The level of the drive voltage VDi in the first period T1 and the level of the drive voltage VDi in the second period T2 vary in directions that differ from each other. For example, the drive voltage VDi rises from the low level to the high level in the first period T1 and falls from the high level to the low level in the second period T2. When the drive voltage VDi whose level varies as described above is applied to the drive electrode EDi, a charge whose sign in the first period T1 and sign in the second period T2 differ from each other is accumulated in the capacitor Cij formed between the drive electrode EDi and the detection electrode ESj.

When the drive voltage VDi applied to the drive electrode EDi rises from the low level to the high level in the first period T1, this voltage change acts on the detection electrode ESj via the capacitor Cij, so that the voltage at the detection electrode ESj increases. When the voltage at the input node Nin becomes higher than the reference voltage VR owing to an increase in the voltage at the detection electrode ESj, the output voltage Vo of the operational amplifier OP decreases, and the voltage at the − terminal side of the feedback capacitor Cs decreases. When the voltage at the − terminal side of the feedback capacitor Cs decreases, the positive charge moves from the detection electrode ESj side of the capacitor Cij to the + terminal side of the feedback capacitor Cs to suppress an increase in the voltage at the detection electrode ESj. Owing to the negative feedback operation of the operational amplifier OP, the voltage at the detection electrode ESj is maintained generally at the reference voltage VR. As a result, the positive third charge Q3 corresponding to the changed amount of the charge in the capacitor Cij in the first period T1 is transmitted to the + terminal side of the feedback capacitor Cs. When the voltage difference from the low level to the high level of the drive voltage VDi is indicated by "VDD", the magnitude of the third charge Q3 becomes generally "Cij×VDD". When the positive third charge Q3 is transmitted to the + terminal side of the feedback capacitor Cs, the voltage Vs at the feedback capacitor Cs increases by "(Cij/Cs)×VDD". The increased amount of the voltage Vs is proportional to the electrostatic capacitance of the capacitor Cij.

On the other hand, when the drive voltage VDi applied to the drive electrode EDi in the second period T2 falls from the high level to the low level, this voltage change acts on the detection electrode ESj via the capacitor Cij, so that the voltage at the detection electrode ESj decreases. When the voltage at the input node Nin becomes lower than the reference voltage VR owing to a decrease in the voltage at the detection electrode ESj, the output voltage Vo at the operational amplifier OP increases, and the voltage at the + terminal side of the feedback capacitor Cs increases. When the voltage at the + terminal side of the feedback capacitor Cs increases, the negative charge moves from the detection electrode ESj side of the capacitor Cij to the − terminal side of the feedback capacitor Cs, to thereby suppress a decrease in the voltage at the detection electrode ESj. Owing to the negative feedback operation of the operational amplifier OP, the voltage at the detection electrode ESj is maintained generally at the reference voltage VR. As a result, a negative fourth charge Q4 corresponding to the changed amount of the charge in the capacitor Cij in the second period T2 is transmitted to the − terminal side of the feedback capacitor Cs. The magnitude of the fourth charge Q4 becomes generally "Cij×VDD". When the negative fourth charge Q4 is transmitted to the − terminal side of the feedback capacitor Cs, the voltage Vs at the feedback capacitor Cs increases by "(Cij/Cs)×VDD". The increased amount of the voltage Vs is proportional to the electrostatic capacitance of the capacitor Cij.

As described above, in the second charge detection circuit 12-j, charges (the third charge Q3 and the fourth charge Q4) whose sign in the first period T1 and sign in the second period T2 differ from each other are input to the input node Nin and are accumulated in the feedback capacitor Cs. Thus, when the first period T1 and the second period T2 are alternately iterated, the voltage Vs at the feedback capacitor Cs increases owing to an operation that is similar to that of the above-described first charge detection circuit 11. The second detection signal Sj is a signal corresponding to the voltage Vs at the feedback capacitor Cs and indicates the electrostatic capacitance of the capacitor Cij.

<Influence of Noise Superimposed on Output of Electrostatic Sensor Portion 10>

Next, a description will be given of an influence that extraneous noise superimposed on an output of the electrostatic sensor portion 10 has on a detection result of the electrostatic capacitance of the capacitor Cij.

As described above, the third charge Q3 accumulated at the + terminal side of the feedback capacitor Cs in the first period T1 and the fourth charge Q4 accumulated at the − terminal side of the feedback capacitor Cs in the second period T2 have different signs. Accordingly, the amount of the charge accumulated in the feedback capacitor Cs after the first period T1 and the second period T2 becomes "Q3+Q4".

On the other hand, when the frequency of noise is assumed to be sufficiently long compared with the cycle Tc of iteration of the first period T1 and the second period T2 (the frequency of noise is sufficiently low compared with "1/Tc"), a charge (hereinafter referred to as "noise charge Qn3", and "Qn3" also indicates the amount of charge) due to noise induced to the detection electrode ESj in the first period T1 and a charge (hereinafter referred to as "noise charge Qn4", and "Qn4" also indicates the amount of charge) due to noise induced to the detection electrode ESj in the second period T2 have generally the same sign. When the third charge Q3 and the noise charge Qn3 have the same sign, the fourth charge Q4 and the noise charge Qn4 have different signs. In this case, the amount of the charge accumulated in the feedback capacitor Cs after the first period T1 and the second period T2 becomes "Q3+Q4+(Qn3−Qn4)", owing to an operation that is similar to the operation of the above-described first charge detection circuit 11. That is, the noise charge Qn3 in the first period T1 and the noise charge Qn4 in the second period T2 cancel each other out, so that the amount of the charge due to the noise decreases.

In the electrostatic sensor portion 10, since the noise charge Qn3 in the first period T1 and the noise charge Qn4 in the second period T2 are both induced to the detection electrode ESj, the noise charge Qn3 and the noise charge Qn4 are likely to be approximately the same. Accordingly, the noise charge Qn1 and the noise charge Qn2 more effectively cancel each other out, so that the amount of noise charge accumulated in the feedback capacitor Cs after the first period T1 and the second period T2 decreases further.

As described above, in the input device according to the present embodiment, an object, such as a finger, contacts the surface 5 of the surface member 4 to apply load thereto, and thus, the closer to the surface 5, the more susceptible to extraneous noise from an object that approaches the surface 5. Since the first positive electrode EP1 is located closer to the surface 5 than the first negative electrode EN1, and the second negative electrode EN2 is located closer to the surface 5 than the second positive electrode EP2, each of the first positive electrode EP1 and the second negative electrode EN2 is more susceptible to an influence of extraneous noise.

When the cycle of extraneous noise is relatively long compared with the cycle Tc of alternate iteration of the first period T1 and the second period T2 (when the frequency of extraneous noise is relatively low), the first charge Q1 transmitted from the first positive electrode EP1 in the first period T1 and the second charge Q2 transmitted from the second negative electrode En2 in the second period T2 are more likely to include noise charges (charges induced by extraneous noise) that are approximately the same. That is, the noise charge Qn1 included in the first charge Q1 and the noise charge Qn2 included in the second charge Q2 become more likely to have approximately the same magnitude with the same sign. Thus, when the sign of one of the first charge Q1 and the second charge Q2 is reversed, and the resulting charge is combined with the other charge, the noise charge Qn1 included in the first charge Q1 and the noise charge Qn2 included in the second charge Q2 cancel each other out in the combined charge, so that the entire noise charge decreases. Accordingly, an influence of extraneous noise can be reduced in the first detection signal Sp corresponding to the amount of accumulation of the combined charge.

Also, in the input device according to the present embodiment, in the switch circuit 20, since the path through which the charge is transmitted from the piezoelectric sensors P1 and P2 to the first charge detection circuit 11 is switched in accordance with the drive voltage VDp, the configuration for controlling the switch circuit 20 becomes simple.

In addition, in the input device according to the present embodiment, the first charge detection circuit 11 used for the piezoelectric sensors (P1 and P2) and the second charge detection circuits 12-1 to 12-m used for the electrostatic sensor portion 10 have substantially the same configuration. Thus, these charge detection circuits can be easily formed on the same IC, and a dedicated charge detection circuit for the piezoelectric sensors (P1 and P2) do not have to be provided, thus making it possible to simplify the circuit configuration.

Also, in the input device according to the present embodiment, the drive electrode EDi is disposed closer to the surface 5 than the detection electrode ESj, and the first piezoelectric sensor P1 and the second piezoelectric sensor P2 are disposed closer to the surface 5 than the drive electrode EDi. The first piezoelectric sensor P1 and the second piezoelectric sensor P2 are disposed at places where at least part of the first piezoelectric sensor P1 and the second piezoelectric sensor P2 overlaps the drive electrode EDi in a plan view viewed from the direction facing the surface 5.

Hence, the area in which the capacitor Cij is formed and that is located between the detection electrode ESj and the drive electrode EDi is not covered from the surface 5 side by the first piezoelectric sensor P1 and the second piezoelectric sensor P2, thus allowing a change in the electrostatic capacitance of the capacitor Cij to be more likely to occur with respect to an object, such as a finger, that approaches from the surface 5 side. Also, since the first piezoelectric sensor P1 and the second piezoelectric sensor P2 are separated from the detection electrode ESj with the drive electrode EDi being interposed therebetween, a parasitic capacitor between the first piezoelectric sensor P1 and the second piezoelectric sensor P2 and the detection electrode ESj becomes less likely to occur, thus suppressing a reduction in the detection accuracy of the capacitor Cij. In addition, since the detection electrode ESj is farther from the surface 5 than the drive electrode EDi, extraneous noise from an object that approaches the surface 5 becomes less likely to act on the detection electrode ESj, thus suppressing or reducing variations in a detection result of the electrostatic capacitance due to noise.

In the above-described example in FIG. 3, in the first piezoelectric sensor P1, the first positive electrode EP1 is closer to the surface 5 than the first negative electrode EN1, and in the second piezoelectric sensor P2, the second negative electrode EN2 is closer to the surface 5 than the first positive electrode EP1, but this positional relationship may be reversed. That is, in the first piezoelectric sensor P1, the first negative electrode EN1 may be closer to the surface 5 than the first positive electrode EP1, and in the second piezoelectric sensor P2, the second positive electrode EP2 may be closer to the surface 5 than the second negative electrode EN2.

Also, in the above-described example in FIG. 4, in the first period T1 and the second period T2, the first negative electrode EN1 of the first piezoelectric sensor P1 which is connected to the reference voltage VR and the second positive electrode EP2 of the second piezoelectric sensor P2 are switched therebetween by the switch SW6. However, in another example of the present embodiment, the switch SW6 may be omitted, and both the electrodes (EN1 and EP1) may be directly connected to the reference voltage VR.

Second Embodiment

Figure 9:
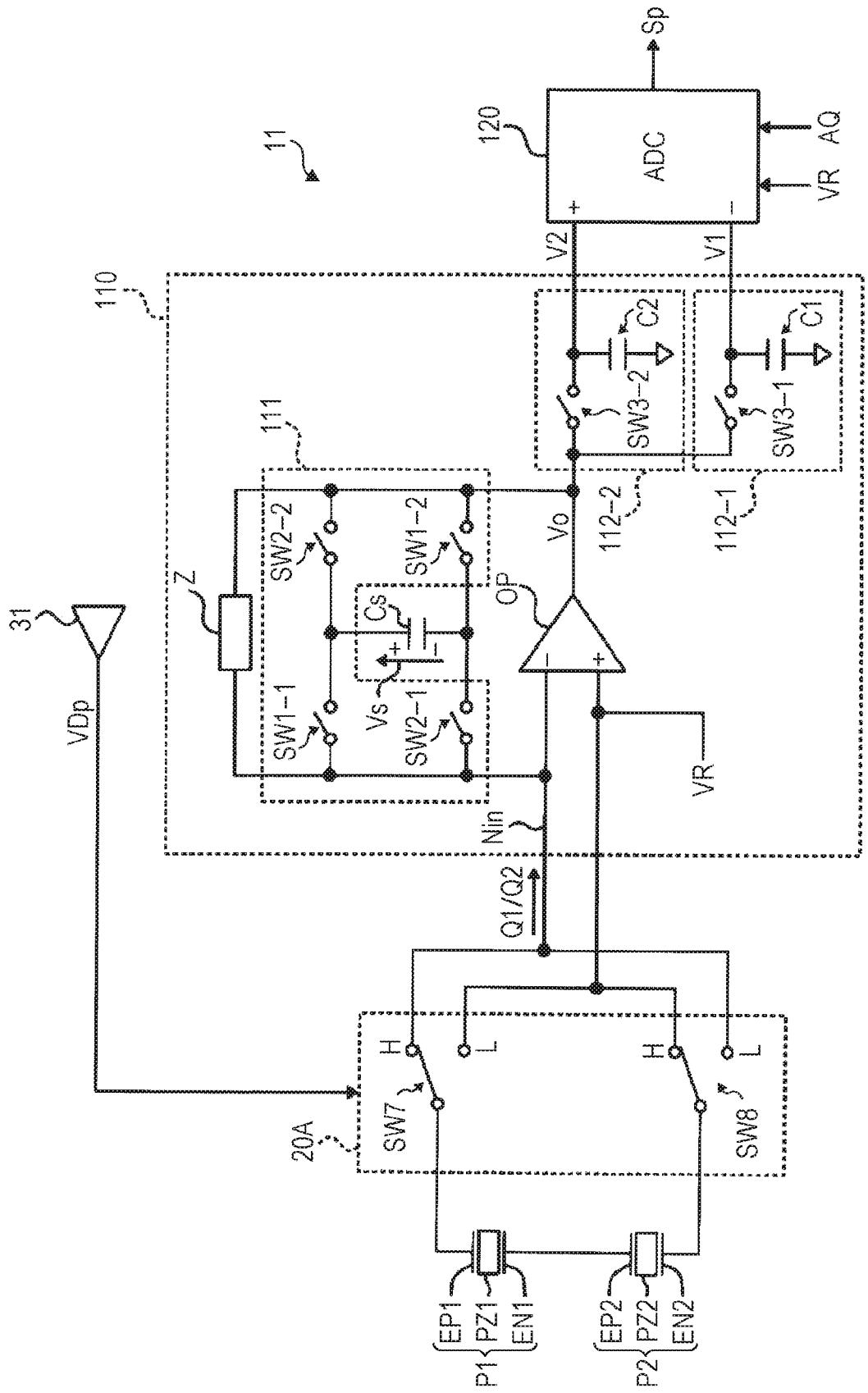
FIG. 9 is a diagram illustrating a configuration example of a first charge detection circuit and a switch circuit in an input device according to a second embodiment.

Next, a description will be given of an input device according to a second embodiment. FIG. 9 is a diagram illustrating a configuration example of a first charge detection circuit 11 and a switch circuit 20A in an input device according to the second embodiment. The input device according to the present embodiment is an input device in which the switch circuit 20 in the input device according to the first embodiment is replaced with the switch circuit 20A, and a first negative electrode EN1 of a first piezoelectric sensor P1 and a second positive electrode EP2 of a second piezoelectric sensor P2 are brought into electrical continuity, and other configurations are the same as the input device according to the first embodiment. Differences from the input device according to the first embodiment will be mainly described below.

The first piezoelectric sensor P1 and the second piezoelectric sensor P2 are connected in series so that one end serves as a positive electrode and another end serves as a negative electrode. In the example in FIG. 9, the first negative electrode EN1 and the second positive electrode EP2 are connected to each other so that one end serves as a first positive electrode EP1, and another end serves as a second negative electrode EN2.

In a first period T1, the switch circuit 20A connects the first positive electrode EP1 at one end to the input node Nin and also connects the second negative electrode EN2 at the other end to the reference voltage VR, and in a second period T2, the switch circuit 20A connects the second negative electrode EN2 at the other end to the input node Nin and also connects the first positive electrode EP1 at the one end to the reference voltage VR.

In the example in FIG. 9, the switch circuit 20A includes a switches SW7 and SW8. The switch SW7 connects the first positive electrode EP1 to the input node Nin when the drive voltage VDp is at a high level and connects the first positive electrode EP1 to the reference voltage VR when the drive voltage VDp is at a low level. The switch SW8 connects the second negative electrode EN2 to the reference voltage VR when the drive voltage VDp is at the high level and connects the second negative electrode EN2 to the input node Nin when the drive voltage VDp is at the low level.

In the input device according to the present embodiment, in the first period T1, a first charge Q1 is transmitted from the first positive electrode EP1 of the first piezoelectric sensor P1 to the + terminal side of the feedback capacitor Cs, and in the second period T2, a second charge Q2 is transmitted from the second negative electrode EN2 of the second piezoelectric sensor P2 to the − terminal side of the feedback capacitor Cs, as in the above-described input device according to the first embodiment. When the direction of a change in pressure in the first period T1 and the direction of a change in pressure in the second period T2 are the same, the first charge Q1 and the second charge Q2 have different signs. Accordingly, owing to an operation that is similar to the operation of the input device according to the first embodiment, a voltage Vs at the feedback capacitor Cs increases or decreases as a result of repetition of the first period T1 and the second period T2, and a first detection signal Sp corresponding to an increased amount or decreased amount of the voltage Vs is generated. The first detection signal Sp becomes a signal corresponding to the magnitude of the change in the pressure.

Also, in the input device according to the present embodiment, the first positive electrode EP1 and the second negative electrode EN2 are located close to the surface 5, so that noise that are akin to each other are likely to be induced thereto, as in the above-described input device according to the first embodiment. Thus, the noise charge Qn1 induced to the first positive electrode EP1 in the first period T1 and the noise charge Qn2 induced to the second negative electrode EN2 in the second period T2 are likely to have amounts that are approximately the same. Hence, the noise charge Qn1 and the noise charge Qn2 more effectively cancel each other out, so that the amount of noise charge accumulated in the feedback capacitor Cs after the first period T1 and the second period T2 decreases further.

Third Embodiment

Figure 10:
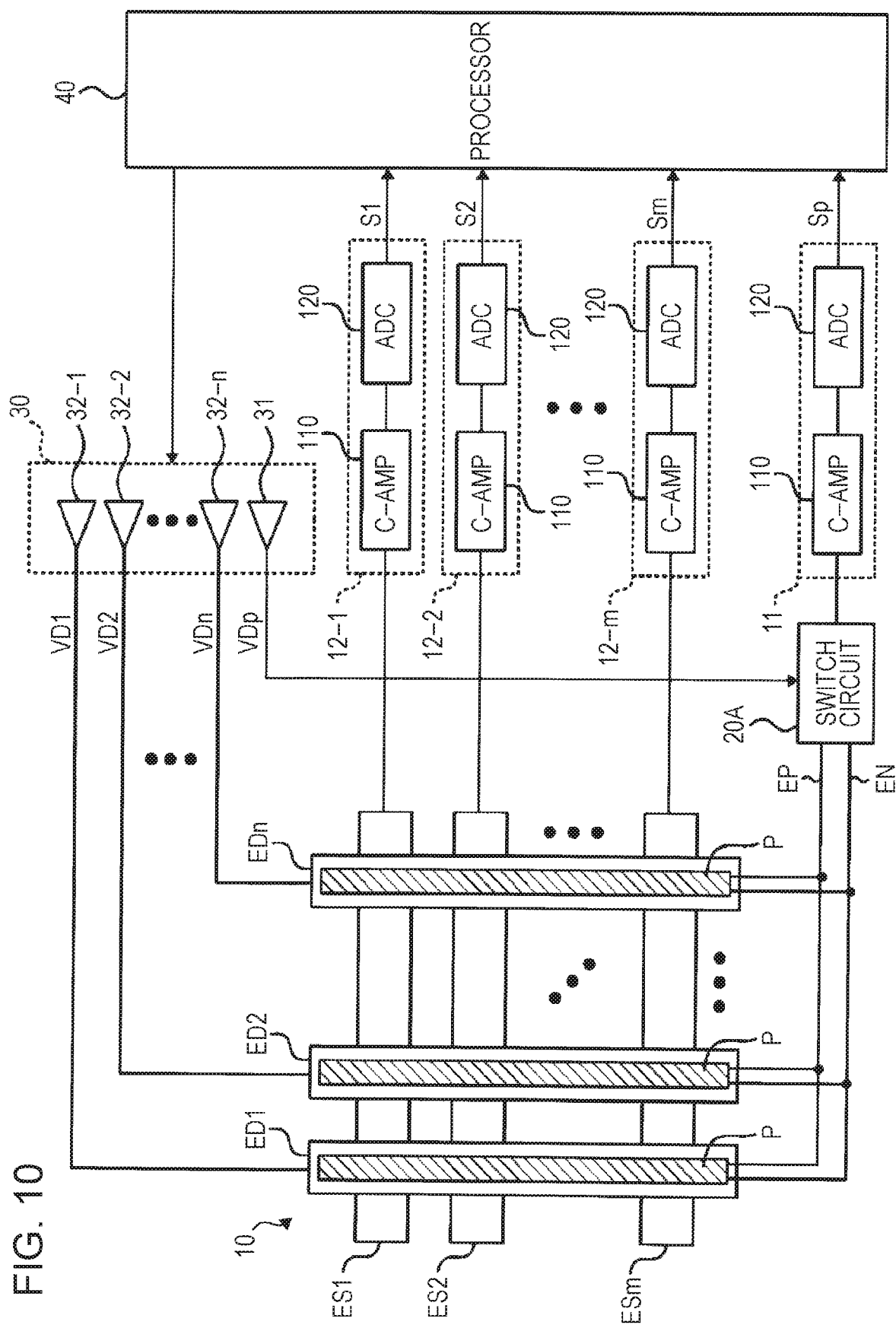
FIG. 10 is a diagram illustrating one example of the configuration of an input device according to a third embodiment.
Figure 11:
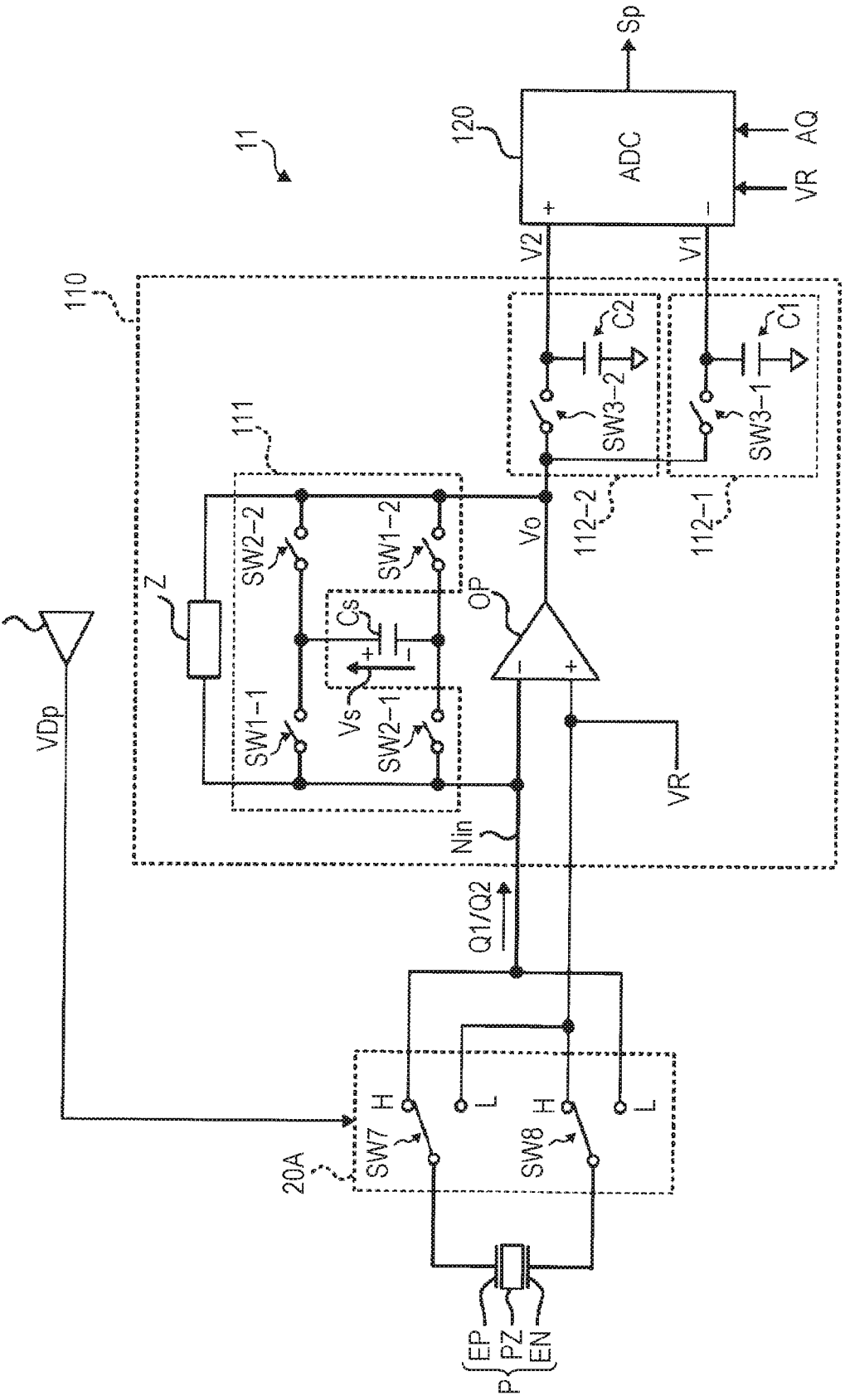
FIG. 11 is a diagram illustrating a configuration example of a first charge detection circuit and a switch circuit in the input device according to the third embodiment.

Next, a description will be given of an input device according to a third embodiment. FIG. 10 is a diagram illustrating one example of the configuration of an input device according to the third embodiment. FIG. 11 is a diagram illustrating a configuration example of a first charge detection circuit 11 and a switch circuit 20A in the input device according to the present embodiment. The input device according to the present embodiment is an input device in which two piezoelectric sensors (P1 and P2) connected in series in the input device according to the second embodiment is replaced with one piezoelectric sensor P, and other configurations are the same as the input device according to the second embodiment. Differences from the input device according to the second embodiment will be mainly described below.

Figure 12:
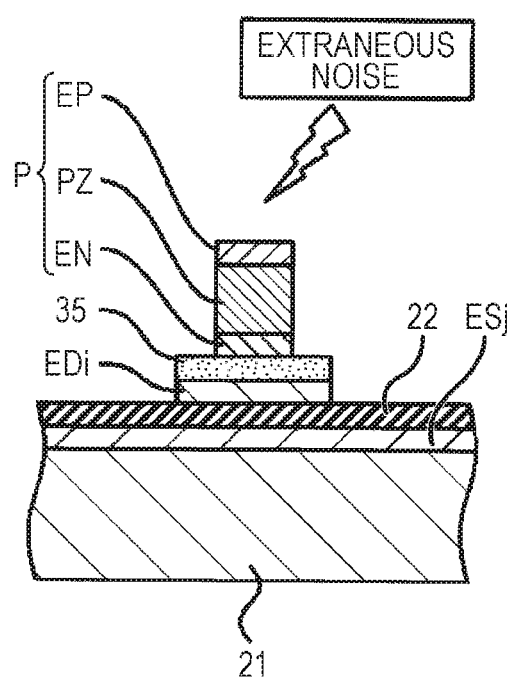
FIG. 12 is a sectional view illustrating one example of the structure of a portion where a detection electrode and a drive electrode intersect each other in the input device according to the third embodiment.

FIG. 12 is a sectional view illustrating one example of the structure of a portion where a detection electrode ESj and a drive electrode EDi intersect each other in the input device according to the present embodiment. In the example in FIG. 12, the detection electrode ESj is formed on a substrate 21 of a circuit board 2, and the drive electrode EDi is formed on an upper layer side (a surface 5 side) of the detection electrode ESj via an insulating layer 22, as in the example in FIG. 3. Each piezoelectric sensor P is located more adjacent to the surface 5 than the drive electrode EDi and is attached to the circuit board 2 via an adhesion layer 35. The piezoelectric sensor P is disposed at a place where at least part of the piezoelectric sensor P overlaps the drive electrode EDi in a plan view viewed from a direction facing the surface 5. The piezoelectric sensors P are attached to the surface 5 side of the drive electrodes ED1 to EDn and extend along the respective drive electrodes ED1 to EDn. At least part of the detection electrodes ES1 to ESm and the drive electrodes ED1 to EDn and at least part of the piezoelectric sensors P are covered by the surface member 4.

Each piezoelectric sensor P includes a piezoelectric member PZ, a positive electrode EP, and a negative electrode EN. The positive electrode EP and the negative electrode EN are provided at portions where charges having different signs are generated in the piezoelectric member PZ. The positive electrode EP is provided at a portion where a positive charge is generated when pressure due to load on the surface member 4 changes in a predetermined direction (for example, when pressure that compresses the piezoelectric member PZ increases). The negative electrode EN is provided at a portion where a negative charge is generated when the pressure changes in the predetermined direction. In the example in FIG. 12, the positive electrode EP is located closer to the surface 5 than the negative electrode EN.

In the input device according to the present embodiment, in a first period T1, a first charge Q1 is transmitted from the positive electrode EP of the piezoelectric sensor P to the + terminal side of a feedback capacitor Cs, and in a second period T2, a second charge Q2 is transmitted from the negative electrode EN of the piezoelectric sensor P to the − terminal side of the feedback capacitor Cs, as in the above-described input device according to the second embodiment. When the direction of a change in pressure in the first period T1 and the direction of a change in pressure in the second period T2 are the same, the first charge Q1 and the second charge Q2 have different signs. Accordingly, owing to an operation that is similar to the operation of the input device according to the second embodiment, a voltage Vs at the feedback capacitor Cs increases or decreases as a result of repetition of the first period T1 and the second period T2, and a first detection signal Sp corresponding to an increased amount or decreased amount of the voltage Vs is generated. The first detection signal Sp becomes a signal corresponding to the magnitude of the change in the pressure.

When two piezoelectric sensors (P1 and P2) connected in series in the input device according to the second embodiment are regarded equivalently as one piezoelectric sensor, both the terminals (EP1 and EN2) of the piezoelectric sensor are located close to the surface 5 in the input device according to the second embodiment. In contrast, the input device according to the present embodiment differs in that only one of the two terminals (EP and EN) of the piezoelectric sensor P is located close to the surface 5. Accordingly, in the input device according to the present embodiment, the difference between the noise charge Qn1 included in the first charge Q1 in the first period T1 and a noise charge Qn2 included in the second charge Q2 in the second period T2 increases, thus making it difficult for the noise charge Qn1 and the noise charge Qn2 to cancel each other out, compared with the input device according to the second embodiment. However, in the input device according to the present embodiment, since the number of piezoelectric sensors becomes one, the configuration becomes simple compared with the input device according to the second embodiment.

Although some embodiments of the present invention have been described above, the present invention is not limited to only the above-described embodiments and includes various variations.

For example, although, in the above-described embodiments, each of the piezoelectric sensors (P, P1, and P2) is located closer to the surface 5 of the surface member 4 than the detection electrode ESj and the drive electrode EDi in the electrostatic sensor portion 10, the present invention is not limited to this example. In another embodiment of the present invention, the electrostatic sensor portion (the detection electrodes and the drive electrodes) may be located closer to the surface of the surface member than the piezoelectric sensor.

Also, although, in the above-described embodiments, a configuration in which one first detection signal Sp is obtained as a detection result of pressure due to depressing load on the surface member 4 is used, the present invention is not limited to this example. In another embodiment of the present invention, a plurality of pressure detectors (units including piezoelectric sensors, switch circuits, and first charge detection circuits) that independently generate first detection signals, respectively, may also be provided.

For example, when a pattern of n piezoelectric sensors is formed along n drive electrodes ED1 to EDn, this pattern of the n piezoelectric sensors may be divided into a plurality of blocks and be connected in parallel for the respective blocks, rather than being all connected in parallel as illustrated in FIG. 2. When the switch circuits and the first charge detection circuits are provided for the respective blocks and are connected to the piezoelectric sensors, first detection signals can be generated for the respective blocks.

Although, in the above-described embodiments, an electrostatic capacitance change due to proximity of an object is detected, the present invention is not limited to this example. In another embodiment of the present invention, the circuit for detecting a change in the electrostatic capacitance may be omitted to perform only detection of pressure due to load.

An input device according to a first aspect of the present invention is an input device that inputs information corresponding to a change in pressure due to load. The input device includes: a first piezoelectric sensor and a second piezoelectric sensor that respectively generate charges corresponding to the change in the pressure due to the load; a first charge detection circuit that outputs a first detection signal corresponding to the charge generated in the first piezoelectric sensor and the charge generated in the second piezoelectric sensor; a switch circuit that is provided on a path through which the charges are transmitted from the first piezoelectric sensor and the second piezoelectric sensor to the first charge detection circuit; and a surface member that has a surface for receiving the load and that covers at least part of the first piezoelectric sensor and the second piezoelectric sensor.

The first piezoelectric sensor includes: a first piezoelectric member, a first negative electrode that is provided at a portion where a negative charge is generated in the first piezoelectric member when the pressure changes in a predetermined direction, and a first positive electrode that is provided at a portion where a positive charge is generated in the first piezoelectric member when the pressure changes in the predetermined direction and that is located closer to the surface than the first negative electrode.

The second piezoelectric sensor includes: a second piezoelectric member, a second positive electrode that is provided at a portion where a positive charge is generated in the second piezoelectric member when the pressure changes in the predetermined direction, and a second negative electrode that is provided at a position where a negative charge is generated in the second piezoelectric member when the pressure changes in the predetermined direction and that is located closer to the surface than the second positive electrode.

The first charge detection circuit alternately iterates a first period in which the charge from the first piezoelectric sensor is input as a first charge and a second period in which the charge from the second piezoelectric sensor is input as a second charge, reverses a sign of one of the first charge and the second charge, combines a resulting charge with the other charge, and outputs the first detection signal corresponding to an amount of accumulation of the combined charge. The switch circuit forms a path through which a charge is transmitted from the first positive electrode to the first charge detection circuit in the first period and forms a path through which a charge is transmitted from the second negative electrode to the first charge detection circuit in the second period.

According to the input device according to the first aspect, when the pressure changes in the predetermined direction, the positive charge is transmitted from the first positive electrode to the first charge detection circuit via the switch circuit in the first period, and the negative charge is transmitted from the second negative electrode to the first charge detection circuit via the switch circuit in the second period. Also, when the pressure changes in the direction opposite to the predetermined direction, the negative charge is transmitted from the first positive electrode to the first charge detection circuit via the switch circuit in the first period, and the positive charge is transmitted from the second negative electrode to the first charge detection circuit via the switch circuit in the second period. That is, when the direction of a change in the pressure in the first period and the direction of a change in the pressure in the second period are the same, the first charge input to the first charge detection circuit in the first period and the second charge input to the first charge detection circuit in the second period have different signs. Thus, when the sign of one of the first charge and the second charge is reversed, and the resulting charge is combined with the other change, the combined charge has a magnitude corresponding to the change in the pressure. Accordingly, the first detection signal corresponding to the amount of accumulation of the combined charge becomes a signal corresponding to the change in the pressure.

Also, according to the input device according to the first aspect described above, an object, such as a finger, contacts the surface of the surface member to apply load thereto, and thus, the closer to the surface, the more susceptible to extraneous noise from an object that approaches the surface. Since the first positive electrode is located closer to the surface than the first negative electrode, and the second negative electrode is located closer to the surface than the second positive electrode, each of the first positive electrode and the second negative electrode is more susceptible to an influence of extraneous noise. In this case, when the cycle of extraneous noise is relatively long compared with the cycle of alternate iteration of the first period and the second period (when the frequency of extraneous noise is relatively low), the first charge transmitted from the first positive electrode in the first period and the second charge transmitted from the second negative electrode in the second period become more likely to include noise charges that are approximately the same (charges induced by extraneous noise). That is, noise charge included in the first charge and noise charge included in the second charge become more likely to have approximately the same magnitude with the same sign. Thus, when the sign of one of the first charge and the second charge is reversed, and the resulting charge is combined with the other change, the noise charge included in the first charge and the noise charge included in the second charge cancel each other out in the combined charge, so the entire noise charge decreases. Accordingly, an influence of extraneous noise is reduced in the first detection signal corresponding to the amount of accumulation of the combined charge.

Preferably, the first charge detection circuit may input a charge from an input node so that a voltage at the input node approaches a reference voltage. The switch circuit may connect the first positive electrode to the input node in the first period and may connect the second negative electrode to the input node in the second period. The reference voltage may be applied to the first negative electrode and the second positive electrode.

According to this configuration, in the first period, the first charge generated in the first piezoelectric member is transmitted from the first positive electrode to the input node so that the voltage difference between the first positive electrode and the first negative electrode decreases. In the second period, the second charge generated in the second piezoelectric member is transmitted from the second negative electrode to the input node so that the voltage difference between the second negative electrode and the second positive electrode decreases.

Preferably, the switch circuit may connect the first negative electrode to the reference voltage in the first period and may connect the second positive electrode to the reference voltage in the second period.

Preferably, the first negative electrode and the second positive electrode may be electrically continuous with each other. The first charge detection circuit may input a charge from the input node so that a voltage at the input node approaches a reference voltage. In the first period, the switch circuit may connect the first positive electrode to the input node and also connect the second negative electrode to the reference voltage, and in the second period, the switch circuit may connect the second negative electrode to the input node and also connect the first positive electrode to the reference voltage.

According to this configuration, in the first period, the first charge generated in the first piezoelectric member is transmitted from the first positive electrode to the input node so that the voltage difference between the first positive electrode and the second negative electrode decreases. In the second period, the second charge generated in the second piezoelectric member is transmitted from the second negative electrode to the input node so that the voltage difference between the second negative electrode and the first positive electrode decreases.

Preferably, the first charge detection circuit may include: a feedback capacitor, one end thereof being connected to the input node; an operational amplifier that outputs an output voltage to another end of the feedback capacitor, the output voltage being a voltage obtained by amplifying a difference between a voltage at the input node and the reference voltage; and a connection switching circuit that switches between a direction of connection of the feedback capacitor between an output terminal of the output voltage of the operational amplifier and the input node in the first period and the direction of the connection of the feedback capacitor between the output terminal and the input node in the second period.

Preferably, the input device according to the first aspect described above may include: a detection electrode and a drive electrode that form a capacitor whose electrostatic capacitance changes in response to proximity of an object that applies the load; a drive circuit that applies, to the drive electrode, a periodic drive voltage whose level in the first period and level in the second period change in directions that differ from each other; and a second charge detection circuit that outputs a second detection signal corresponding to a charge input from the capacitor via the detection electrode in response to a change in the drive voltage. The second charge detection circuit may input the charge from the capacitor as a third charge in the first period, input the charge from the capacitor as a fourth charge in the second period, reverse a sign of one of the third charge and the fourth charge, combine a resulting charge with the other charge, and output the second detection signal corresponding to an amount of accumulation of the combined charge. In accordance with the drive voltage, the switch circuit may switch a path through which the charges are transmitted from the first piezoelectric sensor and the second piezoelectric sensor to the first charge detection circuit.

According to this configuration, a periodic drive voltage whose level in the first period and level in the second period change in directions that differ from each other is applied to the drive electrode. Thus, a changed amount of a charge in the capacitor in response to the change in the drive voltage in the first period and a changed amount of a charge in the capacitor in response to the change in the drive voltage in the second period have signs that differ from each other. A charge corresponding to the changed amount of the charge in the capacitor in response to the change in the drive voltage is input to the second charge detection circuit. The third charge input to the second charge detection circuit from the capacitor in the first period and the fourth charge input to the second charge detection circuit from the capacitor in the second period have different signs. Thus, when the sign of one of the third charge and the fourth charge is reversed, and the resulting charge is combined with the other charge, the combined charge has a magnitude corresponding to the electrostatic capacitance of the capacitor. Accordingly, the second detection signal corresponding to the amount of accumulation of the combined charge becomes a signal corresponding to the electrostatic capacitance of the capacitor.

In this case, when the cycle of extraneous noise is relatively long compared with the cycle of alternate iteration of the first period and the second period (when the frequency of extraneous noise is relatively low), the third charge transmitted from the detection electrode in the first period and the fourth charge transmitted from the detection electrode in the second period become more likely to include noise charges that are approximately the same (charges induced by extraneous noise). That is, the noise charge included in the third charge and the noise charge included in the fourth charge become more likely to have magnitudes that are approximately the same with the same sign. Thus, when the sign of one of the third charge and the fourth charge is reversed, and the resulting charge is combined with the other charge, the noise charge included in the third charge and the noise charge included in the fourth charge cancel each other out in the combined charge, so that the entire noise charge decreases. Accordingly, an influence of extraneous noise is reduced in the second detection signal corresponding to the amount of accumulation of the combined charge.

Also, in the switch circuit, the path through which the charge is transmitted from the piezoelectric sensor to the first charge detection circuit is switched according to the drive voltage, thus simplifying the configuration for controlling the switch circuit.

Preferably, the drive electrode may be disposed closer to the surface than the detection electrode. The first piezoelectric sensor and the second piezoelectric sensor may be disposed at places that are closer to the surface than the drive electrode and where at least part of the first piezoelectric sensor and the second piezoelectric sensor overlaps the drive electrode in a plan view viewed from a direction facing the surface.

According to this configuration, since the area in which the capacitor is formed and that is located between the detection electrode and the drive electrode is not covered by the piezoelectric sensor from the surface side, a change in the electrostatic capacitance of the capacitor becomes more likely to occur with respect to an object that approaches from the surface side. Also, since the piezoelectric sensor and the detection electrode are separated from each other with the drive electrode being interposed therebetween, a parasitic capacitor between the piezoelectric sensor and the detection electrode is less likely to occur. In addition, since the detection electrode is farther from the surface than the drive electrode, extraneous noise from an object that approaches the surface is less likely to act on the detection electrode.

Preferably, the second charge detection circuit may include: a feedback capacitor, one end thereof being connected to the detection electrode; an operational amplifier that outputs an output voltage to another end of the feedback capacitor, the output voltage being a voltage obtained by amplifying a difference between a voltage at the detection electrode and the reference voltage; and a connection switching circuit that switches a direction of connection of the feedback capacitor between an output terminal of the output voltage of the operational amplifier and the detection electrode.

For example, the first charge detection circuit and the second charge detection circuit may have substantially the same circuit configuration.

An input device according to a second aspect of the present invention is an input device that inputs information corresponding to a change in pressure due to load. The input device includes: a piezoelectric sensor that generates a charge corresponding to the change in the pressure due to the load; a first charge detection circuit that outputs a first detection signal corresponding to the charge generated in the piezoelectric sensor; and a switch circuit that is provided on a path through which the charge is transmitted from the piezoelectric sensor to the first charge detection circuit. The piezoelectric sensor includes: a piezoelectric member, a positive electrode that is provided at a portion where a positive charge is generated in the piezoelectric member when the pressure changes in a predetermined direction, and a negative electrode that is provided at a portion where a negative charge is generated in the piezoelectric member when the pressure changes in the predetermined direction. The first charge detection circuit alternately iterates a first period in which the charge from the piezoelectric sensor is input as a first charge and a second period in which the charge from the piezoelectric sensor is input as a second charge, reverses a sign of one of the first charge and the second charge, combines a resulting charge with the other charge, and outputs the first detection signal corresponding to an amount of accumulation of the combined charge. The switch circuit forms a path through which a charge is transmitted from the positive electrode to the first charge detection circuit in the first period and forms a path through which a charge is transmitted from the negative electrode to the first charge detection circuit in the second period.

According to the input device according to the second aspect described above, when the pressure changes in the predetermined direction, the positive charge is transmitted from the positive electrode to the charge detection circuit via the switch circuit in the first period, and the negative charge is transmitted from the first charge detection circuit to the negative electrode via the switch circuit in the second period. Also, when the pressure changes in the direction opposite to the predetermined direction, the negative charge is transmitted from the positive electrode to the first charge detection circuit via the switch circuit in the first period, and the positive charge is transmitted from the negative electrode to the first charge detection circuit via the switch circuit in the second period. When the direction of a change in the pressure in the first period and the direction of a change in the pressure in the second period are the same, the first charge input to the first charge detection circuit in the first period and the second charge input to the first charge detection circuit in the second period have different signs. Thus, when the sign of one of the first charge and the second charge is reversed, and the resulting charge is combined with the other change, the combined charge has a magnitude corresponding to the change in the pressure. Accordingly, the first detection signal corresponding to the amount of accumulation of the combined charge becomes a signal corresponding to the change in the pressure.

An input device according to a third aspect of the present invention is an input device that inputs information corresponding to a change in pressure due to load. The input device includes: a piezoelectric sensor that generates a charge corresponding to the change in the pressure; a first charge detection circuit that outputs a first detection signal corresponding to the charge generated in the piezoelectric sensor; a detection electrode and a drive electrode that form a capacitor whose electrostatic capacitance changes in response to proximity of an object that applies the load; a drive circuit that applies a periodic drive voltage to the drive electrode; a second charge detection circuit that inputs a charge, accumulated in the capacitor in response to a change in the drive voltage, from the detection electrode and outputs a second detection signal corresponding to the input charge; and a surface member that has a surface for receiving the load and that covers at least part of the piezoelectric sensor, the detection electrode, and the drive electrode. The drive electrode is disposed closer to the surface than the detection electrode. The piezoelectric sensor is disposed at a place that is closer to the surface than the drive electrode and where at least part of the piezoelectric sensor overlaps the drive electrode in a plan view viewed from a direction facing the surface.

According to the input device according to the third aspect described above, since the area in which the capacitor is formed and that is located between the detection electrode and the drive electrode is not covered by the piezoelectric sensor from the surface side, a change in the electrostatic capacitance of the capacitor becomes more likely to occur with respect to an object that approaches from the surface side. Also, since the piezoelectric sensor and the detection electrode are separated from each other with the drive electrode being interposed therebetween, a parasitic capacitor between the piezoelectric sensor and the detection electrode is less likely to occur. In addition, since the detection electrode is farther from the surface than the drive electrode, extraneous noise from an object that approaches the surface is less likely to act on the detection electrode.

Although the present invention has been described above on the basis of the embodiments, the present invention is not limited to the above-described embodiments, and various modifications and changes can be made thereto within the scope recited in the claims.

What is claimed is:

1. An input device for inputting information corresponding to a change in a pressure due to a load applied thereto, the input device comprising:
   a first piezoelectric sensor and a second piezoelectric sensor that generate a respective charge corresponding to the change in the pressure due to the load;
   a first charge detection circuit configured to output a first detection signal based on the charge generated in the first piezoelectric sensor and the charge generated in the second piezoelectric sensor which are received at an input node of the first charge detection circuit; from the first piezoelectric sensor and the second piezoelectric sensor to the first charge detection circuit, the switch circuit forming a first path during a first time period and a second path during a second time period, the first time period and the second time period being alternately repeated; and
   a surface member having a surface for receiving the load, the surface member covering at least a part of the first piezoelectric sensor and the second piezoelectric sensor,
   wherein the first piezoelectric sensor includes:
      a first piezoelectric member;
      a first negative electrode provided to the first piezoelectric member at a portion where a negative charge is generated when the pressure changes in a predetermined direction; and
      a first positive electrode provided to the first piezoelectric member at a portion where a positive charge is generated when the pressure changes in the predetermined direction, the first positive electrode being disposed closer to the surface than the first negative electrode;
   wherein the second piezoelectric sensor includes:
      a second piezoelectric member;

a second positive electrode provided to the second piezoelectric member at a portion where a positive charge is generated when the pressure changes in the predetermined direction; and a second negative electrode provided to the second piezoelectric member at a portion where a negative charge is generated when the pressure changes in the predetermined direction, the second negative electrode being disposed closer to the surface than the second positive electrode;

wherein the first path transmits a first charge from the first positive electrode to the first charge detection circuit during the first time period, and the second path transmits a second charge from the second negative electrode to the first charge detection circuit during the second time period, and wherein the first charge detection circuit accumulates the first charge during the first time period, accumulates the second charge during the second time period, and combines the first and second charges by reversing a sign of one of the first charge and the second charge to produce a combined charge, thereby outputting the first detection signal corresponding to the combined charge.

2. The input device according to claim 1, wherein:
the first charge detection circuit is further configured to bring a voltage of the charge received at the input node to a reference voltage;
the switch circuit connects the first positive electrode to the input node during the first time period and connects the second negative electrode to the input node during the second time period; and
the reference voltage is applied to the first negative electrode and the second positive electrode.

3. The input device according to claim 2,
wherein the switch circuit connects the first negative electrode to the reference voltage during the first time period and connects the second positive electrode to the reference voltage during the second time period.

4. The input device according to claim 1, wherein:
the first negative electrode and the second positive electrode are electrically connected to each other;
the first charge detection circuit is further configured to bring a voltage of the charge received at the input node to a reference voltage; and
the switch circuit connects the first positive electrode to the input node and connects the second negative electrode to the reference voltage during the first time period, and the switch circuit connects the second negative electrode to the input node and connects the first positive electrode to the reference voltage during the second time period.

5. The input device according to claim 2,
wherein the first charge detection circuit includes:
a feedback capacitor having a first end and a second end, the first end being connected to the input node;
an operational amplifier configured to output an output voltage from an output terminal thereof to the second end of the feedback capacitor, the output voltage being obtained by amplifying a difference between the voltage at the input node and the reference voltage; and
a connection switching circuit configured to alter a direction of connection of the feedback capacitor between the output terminal and the input node by the first time period and the second time period.

6. The input device according to claim 1, the input device further comprising:

a detection electrode and a drive electrode configured to form a capacitor therebetween, an electrostatic capacitance of the capacitor changing in response to proximity of an object that applies the load to the input device;
a drive circuit configured to apply a periodic drive voltage to the drive electrode, the periodic drive voltage having one of a rising edge and a falling edge in the first time period and the other of the rising edge and the falling edge in the second time period; and
a second charge detection circuit configured to output a second detection signal based on a charge received from the capacitor via the detection electrode in response to a change in the drive voltage applied to the drive electrode,
wherein the second charge detection circuit accumulates the charge from the capacitor during the first time period as a third charge, accumulates the charge from the capacitor during the second time period as a fourth charge, and combines the third and fourth charges by reversing a sign of one of the third charge and the fourth charge to produce a second combined charge, thereby outputting the second detection signal corresponding to the second combined charge; and
wherein the switch circuit switches the first path and the second path in accordance with the drive voltage.

7. The input device according to claim 6, wherein
the drive electrode is disposed closer to the surface than the detection electrode, and
the first piezoelectric sensor and the second piezoelectric sensor are disposed closer to the surface than the drive electrode such that at least a part of the first piezoelectric sensor and the second piezoelectric sensor overlaps the drive electrode in a plan view viewed from a direction facing the surface.

8. The input device according to claim 6,
wherein the second charge detection circuit includes:
a feedback capacitor having a first end and a second end, the first end being connected to the detection electrode;
an operational amplifier configured to output an output voltage from an output terminal thereof to the second end of the feedback capacitor, the output voltage being obtained by amplifying a difference between a voltage at the detection electrode and the reference voltage; and
a connection switching circuit configured to switch a direction of connection of the feedback capacitor between the output terminal and the detection electrode.

9. An input device for inputting information corresponding to a change in a pressure due to a load applied thereto, the input device comprising:
a piezoelectric sensor that generates a charge corresponding to the change in the pressure due to the load;
a first charge detection circuit configured to output a first detection signal based on the charge generated in the piezoelectric sensor; and
a switch circuit configured to form a path for transmitting the charge from the piezoelectric sensor to the first charge detection circuit, the switch circuit forming a first path during a first time period and forming a second path during a second time period, the first time period and second time period being alternately repeated;
wherein the piezoelectric sensor includes
a piezoelectric member, a positive electrode provided to the piezoelectric member at a portion where a positive charge is generated when the pressure changes in a predetermined direction, and a negative electrode provided to the piezoelectric member at a portion where a negative charge is generated when the pressure changes in the predetermined direction, wherein the first path transmits a first charge from the positive electrode to the first charge detection circuit during the first time period, and the second path transmits a second charge from the negative electrode to the first charge detection circuit during the second time period, and wherein the first charge detection circuit accumulates the first charge during the first time period, accumulates the second charge during the second time, and combines the first and second charges by reversing a sign of one of the first charge and the second charge to produce a combined charge, thereby outputting the first detection signal corresponding to the combined charge.

10. An input device for inputting information corresponding to a change in a pressure due to a load applied thereto, the input device comprising:

a piezoelectric sensor that generates a charge corresponding to the change in the pressure;

a first charge detection circuit configured to output a first detection signal based on the charge generated in the piezoelectric sensor and input to the first charge detection circuit;

a detection electrode and a drive electrode configured to form a capacitor therebetween, an electrostatic capacitance of the capacitor changing in response to proximity of an object that applies the load to the input device;

a drive circuit configured to apply a periodic drive voltage to the drive electrode;

a second charge detection circuit configured to output a second detection signal based on a charge input thereto from the detection electrode, the charge being accumulated in the capacitor in response to a change in the drive voltage; and a surface member that has a surface for receiving the load and that covers at least a part of the piezoelectric sensor, the detection electrode, and the drive electrode, wherein the drive electrode is disposed closer to the surface than the detection electrode, and the piezoelectric sensor is disposed closer to the surface than the drive electrode such that at least a part of the piezoelectric sensor overlaps the drive electrode in a plan view viewed from a direction facing the surface.

11. The input device according to claim 1, wherein the first charge detection circuit accumulates the first charge and the second charge for a plurality of repetitions of the first time period and the second time period, respectively, before combining into the combined charge.

12. The input device according to claim 9, wherein the first charge detection circuit accumulates the first charge and the second charge for a plurality of repetitions of the first time period and the second time period, respectively, before combining into the combined charge.

\* \* \* \* \*